(12) United States Patent  
Kim et al.

(10) Patent No.: US 10,908,747 B2  
(45) Date of Patent: Feb. 2, 2021

(54) DISPLAY APPARATUS

(71) Applicant: LG DISPLAY CO., LTD., Seoul (KR)

(72) Inventors: Taegung Kim, Osan-si (KR); Kyung-Rok Kim, Osan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 77 days.

(21) Appl. No.: 16/226,278

(22) Filed: Dec. 19, 2018

(65) Prior Publication Data

US 2019/0204954 A1  Jul. 4, 2019

(30) Foreign Application Priority Data

Dec. 29, 2017 (KR) .................. 10-2017-0184827

(51) Int. Cl.

| | | |
|---|---|---|
| *G06F 3/044* | (2006.01) | |
| *G06F 3/041* | (2006.01) | |
| *G09G 3/20* | (2006.01) | |
| *G09G 3/3275* | (2016.01) | |
| *G09G 3/32* | (2016.01) | |
| *H01L 27/32* | (2006.01) | |
| *G09G 3/3241* | (2016.01) | |
| *H01L 51/52* | (2006.01) | |
| *G09G 3/3225* | (2016.01) | |

(52) U.S. Cl.

CPC ............ *G06F 3/044* (2013.01); *G06F 3/0412* (2013.01); *G06F 3/0443* (2019.05); *G06F 3/04164* (2019.05); *G06F 3/04166* (2019.05); *G09G 3/2096* (2013.01); *G09G 3/32* (2013.01); *G09G 3/3225* (2013.01); *G09G 3/3241* (2013.01); *G09G 3/3275* (2013.01); *H01L 27/323* (2013.01); *H01L 27/3258* (2013.01); *G09G 2300/0857* (2013.01); *G09G 2300/0861* (2013.01); *H01L 27/322* (2013.01); *H01L 27/3246* (2013.01); *H01L 27/3272* (2013.01); *H01L 27/3276* (2013.01); *H01L 51/5228* (2013.01)

(58) Field of Classification Search

USPC ........................................................ 345/174  
See application file for complete search history.

(56) References Cited

U.S. PATENT DOCUMENTS

| 2010/0097334 A1* | 4/2010 | Choi ............ G06F 3/0412 345/173 |
| 2015/0153858 A1* | 6/2015 | Kim ............ G06F 3/0412 345/173 |

(Continued)

FOREIGN PATENT DOCUMENTS

KR  20120058540 A  6/2012

*Primary Examiner* — Chineyere D Willis-Burns  
(74) *Attorney, Agent, or Firm* — Polsinelli PC

(57) ABSTRACT

A display apparatus including a substrate including a display area includes a plurality of pixel areas and a non-display area surrounding the display area, a plurality of pixels including a pixel driving chip provided in each of the plurality of pixel areas of the substrate and a light emission part connected to the pixel driving chip, and a plurality of touch electrodes disposed in the display area to overlap two or more pixels. A first pixel driving chip of two or more pixel driving chips overlapping a corresponding touch electrode of the plurality of touch electrodes is connected to the corresponding touch electrode.

26 Claims, 17 Drawing Sheets

(56) References Cited

U.S. PATENT DOCUMENTS

| | | | |
|---|---|---|---|
| 2015/0179724 A1* | 6/2015 | Lee | H01L 27/1255 |
| | | | 257/40 |
| 2015/0348504 A1* | 12/2015 | Sakariya | G09G 3/2092 |
| | | | 345/206 |
| 2015/0371591 A1* | 12/2015 | Suzuki | G09G 3/3291 |
| | | | 345/208 |
| 2016/0216800 A1* | 7/2016 | Cho | G09G 3/3233 |
| 2016/0253014 A1* | 9/2016 | Yang | G09G 3/3208 |
| | | | 345/174 |
| 2016/0253541 A1* | 9/2016 | Yang | G09G 3/3233 |
| | | | 382/124 |
| 2017/0242529 A1* | 8/2017 | Park | G06F 3/044 |
| 2017/0322650 A1 | 11/2017 | Liu et al. | |
| 2018/0059855 A1* | 3/2018 | Gwon | G06F 3/0416 |
| 2018/0203537 A1* | 7/2018 | Kim | G06F 3/0412 |
| 2018/0218668 A1* | 8/2018 | Aoyagi | G09G 3/32 |
| 2019/0369788 A1* | 12/2019 | Tada | H01L 27/3246 |

* cited by examiner

DISPLAY APPARATUS

CROSS REFERENCE TO RELATED APPLICATION

This application claims the benefit of the Korean Patent Application No. 10-2017-0184827 filed on Dec. 29, 2017, which is hereby incorporated by reference in its entirety as if fully set forth herein.

BACKGROUND

Field of the Disclosure

The present disclosure relates to a display apparatus. Although the present disclosure is suitable for a wide scope of applications, it is particularly suitable for providing a display apparatus which senses a user touch with a simplified configuration.

Description of the Background

Display apparatuses are being widely used as a display screen for various products such as televisions (TVs), notebook computers, and monitors as well as portable electronic devices such as mobile communication terminals, electronic notebooks, e-books, portable multimedia players (PMPs), navigation devices, ultra-mobile personal computers (PCs), mobile phones, smartphones, tablet personal computers (PCs), and watch phones.

Generally, the display apparatuses include a display panel including a plurality of pixels and a panel driving circuit for driving the plurality of pixels.

Each of the plurality of pixels includes a switching thin film transistor (TFT), a driving TFT, and one capacitor, which are provided on a substrate through a process of manufacturing TFTs. Recently, four or more TFTs are often provided in one pixel, and moreover, as many as seven TFTs may be needed in one pixel.

The panel driving circuit includes a control board including a timing controller which receives video data from a display driving system or a display set and aligns the video data to generate digital data signals suitable for the display panel and a power management integrated circuit (IC) which generates various voltages, a plurality of data driving ICs which convert the digital data signals into analog data signals and supply the analog data signals to data lines of the display panel, a plurality of flexible circuit films which connect the plurality of data driving ICs to the display panel, a source printed circuit board (PCB) which transfers an output signal of the control board to the plurality of flexible circuit films, a signal cable which connects the control board to the source PCB, and a plurality of gate driving circuits which drive gate lines of the display panel.

Moreover, the display apparatuses may further include a touch driving circuit and a touch panel which senses a pen touch performed by a touch pen, in addition to sensing a finger touch performed by a finger of a user.

Accordingly, the display apparatuses tend to have a complicated configuration due to the panel driving circuit and the touch driving circuit disposed outside the display panel.

SUMMARY

Accordingly, the present disclosure is directed to providing a display apparatus that substantially obviates one or more problems due to limitations and disadvantages of the related art.

An aspect of the present disclosure is directed to providing a display apparatus which senses a user touch and has a simplified configuration.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display apparatus including a substrate including a display area including a plurality of pixel areas and a non-display area surrounding the display area, a plurality of pixels including a pixel driving chip provided in each of the plurality of pixel areas of the substrate and a light emission part connected to the pixel driving chip, and a plurality of touch electrodes disposed in the display area to overlap two or more pixels, wherein a first pixel driving chip of two or more pixel driving chips overlapping a corresponding touch electrode of the plurality of touch electrodes is connected to the corresponding touch electrode.

In another aspect of the present disclosure, there is provided a display apparatus including a substrate including a display area including a plurality of pixel areas and a non-display area surrounding the display area, a plurality of touch electrodes disposed in the display area, a plurality of sensing driving pixels respectively provided in the plurality of pixel areas, overlapping the plurality of touch electrodes, of the substrate and respectively and electrically connected to the plurality of touch electrodes, and a plurality of normal driving pixels respectively provided in the plurality of pixel areas, overlapping the plurality of touch electrodes, of the substrate.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION

Figure 1:
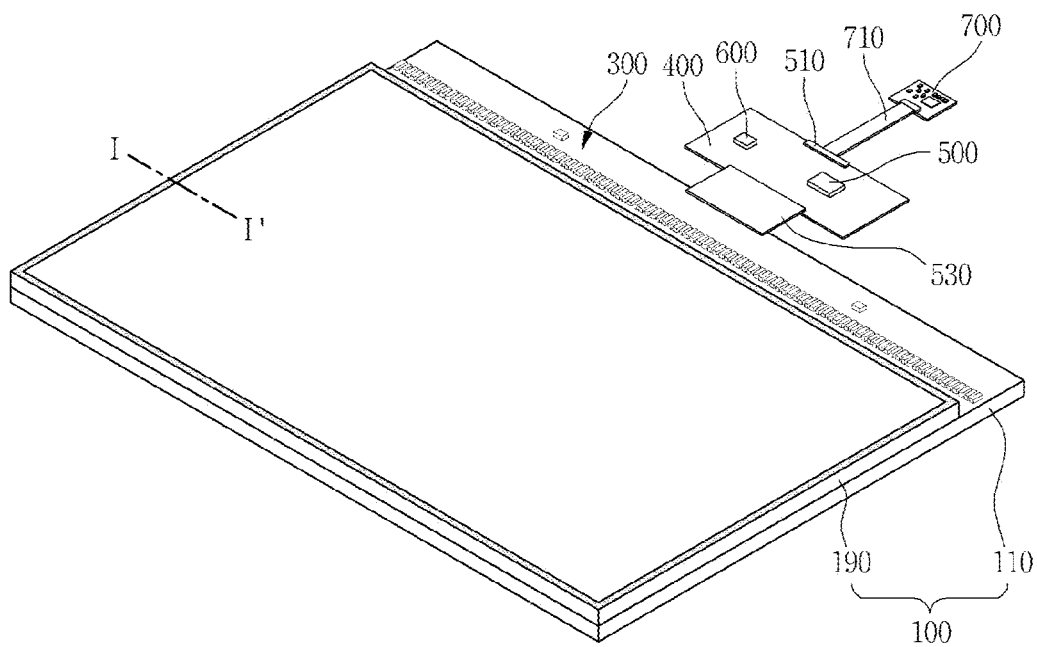
FIG. 1 is a diagram illustrating a display apparatus according to an aspect of the present disclosure.

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~' and 'next~', one or more other parts may be disposed between the two parts unless 'just' or 'direct' is used.

In describing a time relationship, for example, when the temporal order is described as 'after~', 'subsequent', 'next~', and 'before~' a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, aspects of a display apparatus according to the present disclosure will be described in detail with reference to the accompanying drawings. In adding reference numerals to elements of each of the drawings, although the same elements are illustrated in other drawings, like reference numerals may refer to like elements. In the following description, when the detailed description of the relevant known function or configuration is determined to unnecessarily obscure the important point of the present disclosure, the detailed description will be omitted.

Figure 2:
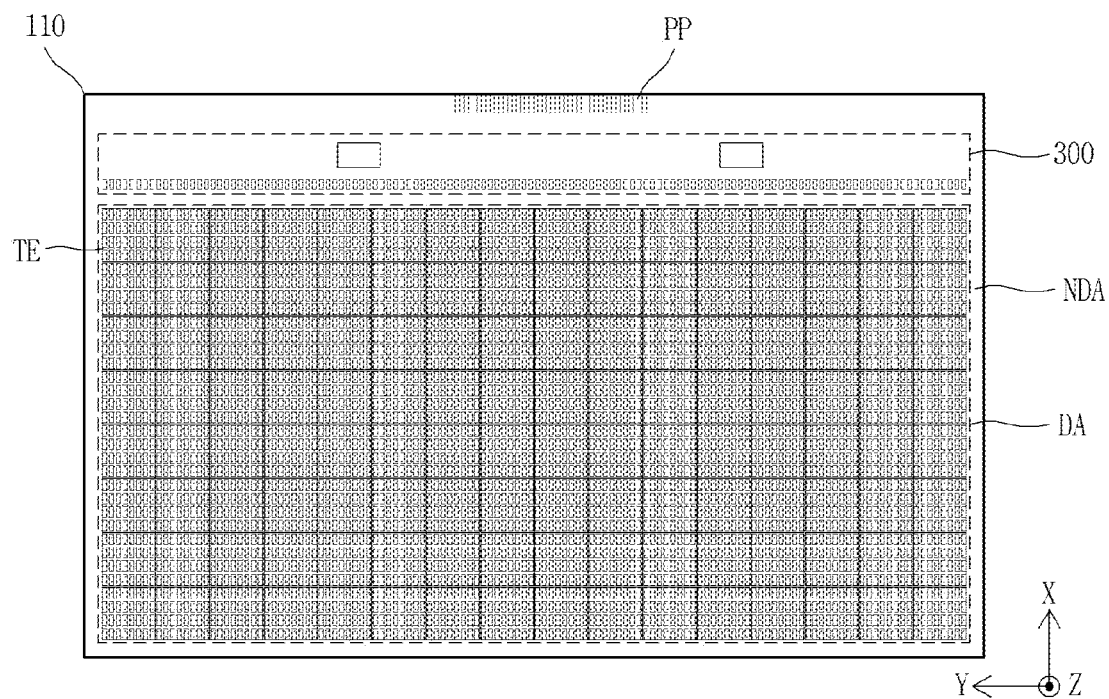
FIG. 2 is a plan view illustrating a substrate illustrated in FIG. 1.
Figure 3:
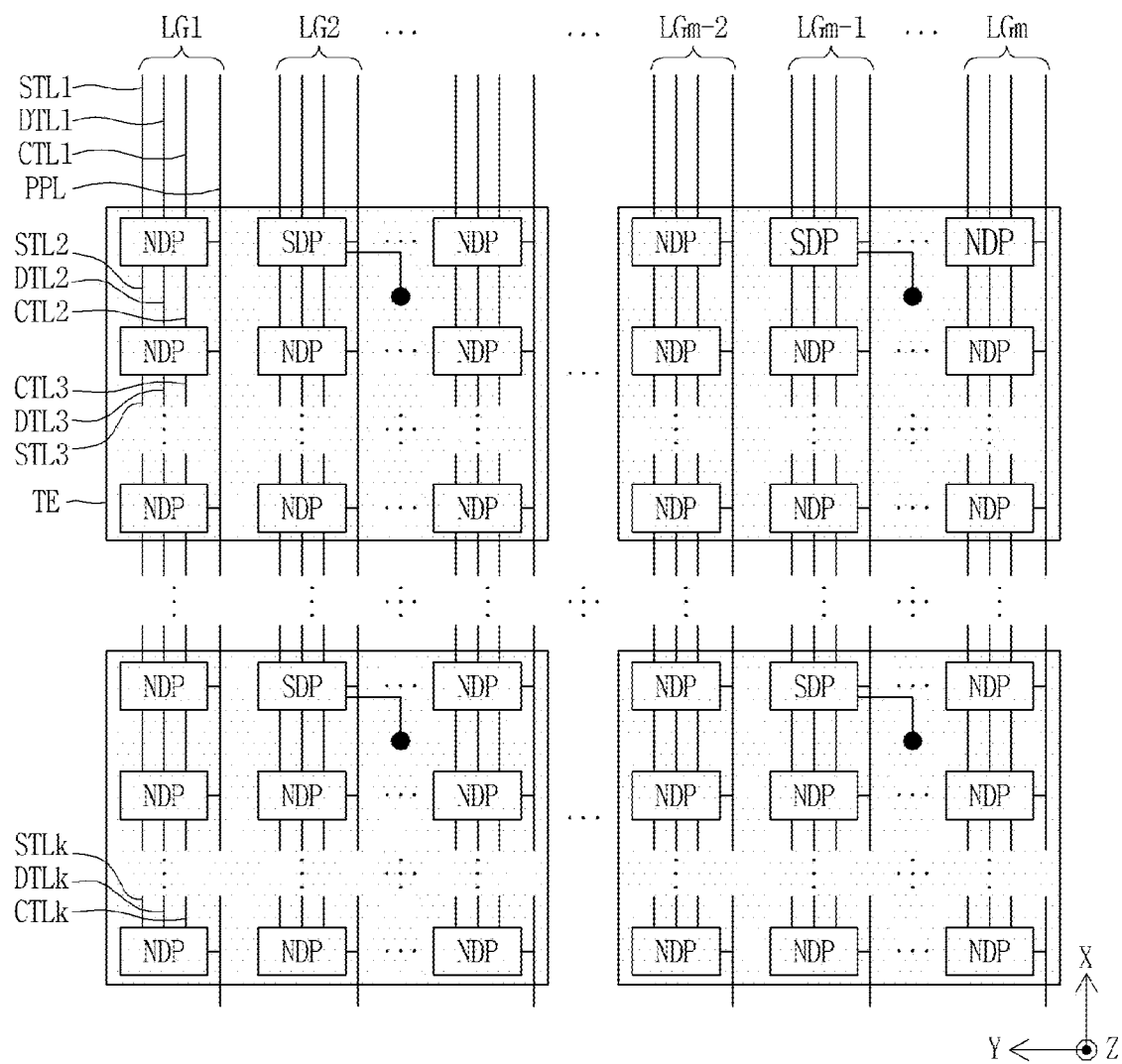
FIG. 3 is a diagram illustrating a disposition structure of a touch electrode, a sensing driving pixel, and a normal driving pixel according to an aspect illustrated in FIG. 2.

FIG. 1 is a diagram illustrating a display apparatus according to an aspect of the present disclosure. FIG. 2 is a plan view illustrating a substrate illustrated in FIG. 1. FIG. 3 is a diagram illustrating a disposition structure of a touch electrode, a sensing driving pixel, and a normal driving pixel according to an aspect illustrated in FIG. 2.

Referring to FIGS. 1 to 3, the display apparatus according to an example of the present disclosure may include a display panel 100 and a data driving circuit unit 300 mounted on the display panel 100.

The display panel 100 may include a substrate 110 and an opposite substrate 190, which face each other. The substrate 110 may be a pixel array substrate and may have a size which is larger than that of the opposite substrate 190, and thus, one edge of the substrate 110 may be exposed without being covered by the opposite substrate 190.

The substrate 110 may be formed of an insulating material such as glass, quartz, ceramic and plastic. For example, the substrate 110 including plastic may be a polyimide film, and particularly, may be a heat-resistant polyimide film capable of enduring a high temperature in a high temperature deposition process. The substrate 110 may include a display area DA including a plurality of pixel areas and a non-display area NDA. The display area DA may be defined as an area which displays an image, and the non-display area NDA may be an area which does not display an image and may be defined in an edge of the substrate 110 to surround the display area DA.

The substrate 110 according to an aspect may include a plurality of touch electrodes TE, a plurality of sensing driving pixels SDP, and a plurality of normal driving pixels NDP.

The plurality of touch electrodes TE may be disposed in the display area DA and may be arranged at certain intervals in a first direction X and a second direction Y intersecting the first direction X. For example, the substrate 110 may include 72 touch electrodes arranged in a lengthwise direction X and 128 touch electrodes arranged in a widthwise direction Y, but is not limited thereto. For example, the number of touch electrodes included in the substrate 110 may be changed based on a resolution and/or a touch resolution of the display apparatus.

Each of the plurality of touch electrodes TE according to an aspect may have a square shape, a rectangular shape, an octagonal shape, a circular shape, or a lozenge shape.

Each of the plurality of normal driving pixels NDP may be disposed in a predetermined normal pixel area of the plurality of pixel areas defined in the display area DA of the substrate 110 and may overlap a corresponding touch electrode of the plurality of touch electrodes TE. Each of the plurality of normal driving pixels NDP may overlap a corresponding touch electrode of the plurality of touch electrodes TE and may be electrically disconnected from the corresponding touch electrode TE. Each of the plurality of normal driving pixels NDP may emit light based on digital pixel data, a clock signal, and a pixel driving voltage input thereto, thereby displaying an image. Also, each of the plurality of normal driving pixels NDP may display an image with the digital pixel data, and during a touch report period, the plurality of normal driving pixels NDP may sequentially transfer touch presence data. Therefore, each of the plurality of normal driving pixels NDP may overlap a corresponding touch electrode TE, but may simply display an image or may transfer only the touch presence data without performing touch sensing through the touch electrodes TE. That is, the normal driving pixels NDP may be defined as pixels which do not perform touch sensing.

The plurality of sensing driving pixels SDP may be disposed in a predetermined touch sensing pixel area of the plurality of pixel areas defined in the display area DA of the substrate 110 and may be respectively connected to the plurality of touch electrodes TE. Each of the plurality of sensing driving pixels SDP may emit light based on the digital pixel data, the clock signal, and the pixel driving voltage input thereto, thereby displaying an image. Simultaneously, each of the plurality of sensing driving pixels SDP may sense a capacitance variation value of a corresponding touch electrode TE to output touch presence data. In this case, the touch presence data generated by each of the plurality of sensing driving pixels SDP may sequentially pass through the plurality of normal driving pixels NDP and at least one sensing driving pixel SDP arranged in the first direction X and may be transferred to the outside, and thus, the number of transfer lines for transferring the touch presence data, generated by each of the plurality of sensing driving pixels SDP, to the outside is minimized. For example, touch presence data generated by a first sensing driving pixel SDP disposed in the first direction X may sequentially pass through only the plurality of normal driving pixels NDP and may be transferred to the outside, touch presence data generated by a second sensing driving pixel SDP disposed in the first direction X may sequentially pass through the plurality of normal driving pixels NDP and a first sensing driving pixel SDP and may be transferred to the outside, and touch presence data generated by a last sensing driving pixel SDP disposed in the first direction X may sequentially pass through all pixels from a last sensing driving pixel SDP to a first normal driving pixel NDP and may be transferred to the outside. For example, the number of sensing driving pixels SDP is smaller than the number of normal driving pixels NDP.

The plurality of sensing driving pixels SDP according to an aspect may be disposed on the substrate 110 and may be respectively connected to a plurality of touch routing lines respectively connected to the plurality of touch electrodes TE. Therefore, each of the plurality of sensing driving pixels SDP may sense a capacitance variation value of a corresponding touch electrode TE through a corresponding touch routing line.

According to another aspect, the plurality of sensing driving pixels SDP may be disposed on the substrate 110 and may be respectively and directly connected to the plurality of touch electrodes TE. Therefore, each of the plurality of sensing driving pixels SDP may directly sense a capacitance variation value of a corresponding touch electrode TE.

One touch electrode TE according to an aspect may overlap 30 pixels arranged in the first direction X and 30 pixels arranged in the second direction Y. In this case, one of 900 pixels overlapping one touch electrode TE may be set as a sensing driving pixel SDP electrically connected to the one touch electrode TE, and the other 899 pixels may be set as normal driving pixels NDP.

The substrate 110 according to an aspect may further include first to $m^{th}$ pixel driving line groups LG1 to LGm for driving the plurality of sensing driving pixels SDP and the plurality of normal driving pixels NDP, wherein m is a natural number equal to or more than two.

The first to $m^{th}$ pixel driving line groups LG1 to LGm may each be disposed between adjacent pixels of pixels NDP and SDP arranged in the first direction X and may sequentially transfer digital pixel data and a reference clock to the pixels NDP and SDP arranged in the first direction X. That is, the first to $m^{th}$ pixel driving line groups LG1 to LGm may sequentially transfer the digital pixel data and the reference clock to the pixels NDP and SDP arranged in the first direction X according to a cascade manner.

Each of the first to $m^{th}$ pixel driving line groups LG1 to LGm according to an aspect may include first to $k^{th}$ sensing data transfer lines STL1 to STLk, first to $k^{th}$ pixel data transfer lines DTL1 to DTLk, first to $k^{th}$ clock transfer lines CTL1 to CTLk, and a pixel driving power line PPL, wherein k is a natural number equal to or more than two.

The first to $k^{th}$ sensing data transfer lines STL1 to STLk may be arranged on the substrate 110 in intervals in the first direction X. That is, each of the first to $k^{th}$ sensing data transfer lines STL1 to STLk may be disposed between two adjacent pixels of a plurality of pixels NDP and SDP arranged in the first direction X and may be electrically connected to two pixels NDP and SDP adjacent to each other in the first direction X. Each of the first to $k^{th}$ sensing data transfer lines STL1 to STLk may transfer touch presence data generated by a corresponding sensing driving pixel of the plurality of sensing driving pixels SDP in order. That is, touch presence data generated by each of the plurality of sensing driving pixels SDP may sequentially pass through pixels NDP and SDP disposed at a front stage and may be transferred to the outside. In this case, each of the first to $k^{th}$ sensing data transfer lines STL1 to STLk may be referred to as a serial data bus.

The first to $k^{th}$ pixel data transfer lines DTL1 to DTLk may be respectively arranged on the substrate 110 in parallel to the first to $k^{th}$ sensing data transfer lines STL1 to STLk. That is, each of the first to $k^{th}$ pixel data transfer lines DTL1 to DTLk may be disposed between two adjacent pixels of a plurality of pixels NDP and SDP arranged in the first direction X and may be electrically connected to two pixels NDP and SDP adjacent to each other in the first direction X. Each of the first to $k^{th}$ pixel data transfer lines DTL1 to DTLk may transfer corresponding digital pixel data to each of the plurality of pixels NDP and SDP arranged in the first direction X in order. That is, digital pixel data which is to be supplied to each of a plurality of pixels NDP and SDP may sequentially pass through pixels NDP and SDP disposed at a front stage and may be supplied to corresponding pixels NDP and SDP. In this case, each of the first to $k^{th}$ pixel data transfer lines DTL1 to DTLk may be referred to as a serial data bus.

The first to $k^{th}$ clock transfer lines CTL1 to CTLk may be respectively arranged on the substrate 110 in parallel to the first to $k^{th}$ pixel data transfer lines DTL1 to DTLk. That is, each of the first to $k^{th}$ clock transfer lines CTL1 to CTLk may be disposed between two adjacent pixels of a plurality of pixels NDP and SDP arranged in the first direction X and may be electrically connected to two pixels NDP and SDP adjacent to each other in the first direction X. Each of the first to $k^{th}$ clock transfer lines CTL1 to CTLk may transfer the reference clock to each of the plurality of pixels NDP and SDP arranged in the first direction X in order. In this case, the reference clock may be supplied to a first clock transfer line CTL1 of each of the first to $m^{th}$ pixel driving line groups LG1 to LGm. In this case, the reference clock may be a signal having a period corresponding to one horizontal period.

The pixel driving power line PPL may be disposed on the substrate 110 in parallel to each of the first to $k^{th}$ clock transfer lines CTL1 to CTLk. The pixel driving power line PPL according to an aspect may be disposed between at least two pixels in the second direction Y and may transfer a pixel driving voltage to a plurality of pixels NDP and SDP arranged in the first direction X. For example, the pixel driving power line PPL may be disposed between two pixels adjacent to each other in the second direction Y, or may be disposed between two adjacent unit pixels. In this case, a unit pixel may include three adjacent red pixel, green pixel, and blue pixel.

The opposite substrate 190 may be an encapsulation substrate or a color filter array substrate including a color filter. The opposite substrate 190 may cover the plurality of pixels NDP and SDP provided on the substrate 110. The opposite substrate 190 according to an aspect may be a glass substrate, a metal foil, a thin metal substrate, a flexible substrate, a plastic film, or the like. For example, the opposite substrate 190 may be a polyethylene terephthalate film, a polyimide film, or the like. The opposite substrate 190 may be bonded to the substrate 110 by a transparent adhesive layer.

The data driving circuit unit 300 may be provided in the non-display area NDA of the substrate 110 and may be connected to the first to $m^{th}$ pixel driving line groups LG1 to LGm.

The data driving circuit unit 300 according to an aspect may generate digital pixel data, the reference clock, and a data start signal from a data interface signal which is supplied through a pad part PP disposed in a first non-display area (or an upper non-display area) of the substrate 110, and based on the generated reference clock and data start signal, the data driving circuit unit 300 may align the digital pixel data according to a pixel arrangement structure and may supply the aligned digital pixel data to a first pixel data transfer line DTL1 of a corresponding pixel driving line group of the first to $m^{th}$ pixel driving line groups LG1 to LGm according to a serial data communication manner. Also, in a touch data reporting period, the data driving circuit unit 300 according to an aspect may collect touch presence data sequentially transferred from the plurality of sensing driving pixels SDP through the first to $k^{th}$ sensing data transfer lines STL1 to STLk to generate touch map data and may output the generated touch map data to the outside through the pad part PP. For example, the data driving circuit unit 300 may include at least one data driving chip which transfers digital pixel data to a corresponding pixel and collects touch presence data to generate touch map data.

The display apparatus according to an aspect of the present disclosure may include a control board 400, a timing controller 500, a power management circuit 600, and a display driving system 700.

The control board 400 may be connected to, through the signal cable (or interface cable) 530, the pad part PP disposed in one non-display area of the substrate 110.

The timing controller 500 may be mounted on the control board 400. The timing controller 500 may perform signal processing on an image signal input thereto to generate a digital data signal and may supply the digital data signal to the data driving circuit unit 300. That is, the timing controller 500 may receive the image signal and a timing synchronization signal supplied from the display driving system 700 through a user connector 510 provided on the control board 400. The timing controller 500 may align the image signal to generate the digital data signal matching a pixel arrangement structure of the display area DA, based on the timing synchronization signal and may supply the generated digital data signal to the data driving circuit unit 300. The timing controller 500 according to an aspect may supply the digital data signal, the reference clock, and the data start signal to the data driving circuit unit 300 by using a high speed serial interface manner, for example, an embedded point to point interface (EPI) manner, a low-voltage differential signaling (LVDS) interface manner, or a mini LVDS interface manner.

Moreover, in the touch data reporting period, the timing controller 500 may receive the touch map data from the data driving circuit unit 300 and may transfer the received touch map data to the display driving system 700. Therefore, the display driving system 700 may receive the touch map data transferred from the timing controller 500, calculate a touch position from the touch map data, and execute an application corresponding to the touch position.

The power management circuit 600 may generate a transistor logic voltage, a ground voltage, and a pixel driving voltage, based on an input power supplied from a power supply of the display driving system 700. Each of the transistor logic voltage and the ground voltage may be used as a driving voltage for the timing controller 500 and the data driving circuit unit 300, and the ground voltage and the pixel driving voltage may be applied to the data driving circuit unit 300 of each of the plurality of pixels P.

The display driving system 700 may be connected to the user connector 510 of the control board 400 through a signal transfer member such as interface cable 710. The display driving system 700 may generate the image signal from a video source and may supply the image signal to the timing controller 500. In this case, the image signal may be supplied to the timing controller 500 by using the high speed serial interface manner (for example, a V-by-one interface manner).

Figure 4:
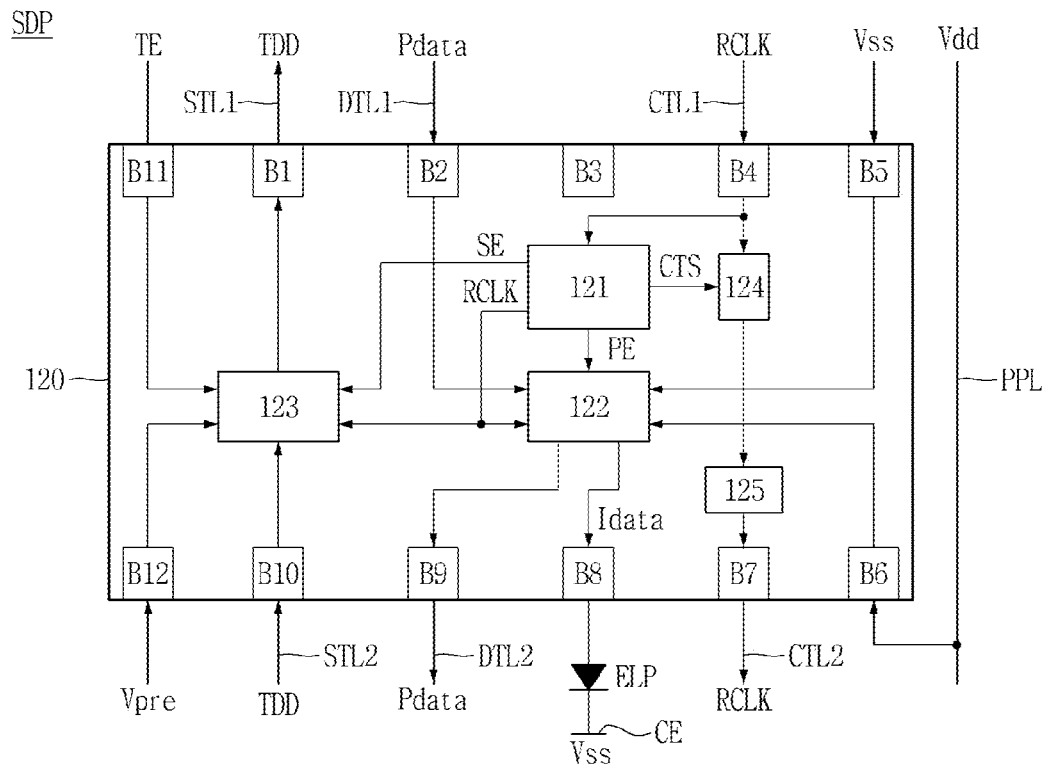
FIG. 4 is a diagram illustrating a sensing driving pixel according to an aspect of the present disclosure illustrated in FIG. 3.

FIG. 4 is a diagram illustrating a sensing driving pixel SDP according to an aspect of the present disclosure illustrated in FIG. 3 and illustrates a sensing driving pixel connected to the touch electrode TE illustrated in FIG. 3.

Referring to FIGS. 3 and 4, the sensing driving pixel SDP according to an aspect of the present disclosure may include a first pixel driving chip 120 and a light emission part ELP.

The first pixel driving chip 120 may be a minimum-unit microchip or one chipset and may be a semiconductor packaging device which includes two or more transistors and one or more capacitors and has a fine size. The first pixel driving chip 120 may be provided in a predetermined touch sensing pixel area of the plurality of pixel areas. The first pixel driving chip 120 may allow the light emission part ELP to emit light, based on a reference clock RCLK, digital pixel data Pdata, and a pixel driving voltage Vdd input thereto and may sense a capacitance variation value of a touch electrode TE to generate and output touch presence data. Also, the first pixel driving chip 120 may transfer the reference clock RCLK and the digital pixel data Pdata, input thereto, to a normal driving pixel NDP provided at a next stage.

The first pixel driving chip 120 according to an aspect may include first to twelfth bumps B1 to B12, a first pixel controller 121, a first pixel driving circuit 122, a touch sensing circuit 123, and a first clock transfer circuit 124. In this case, the bump may be referred to as a pin or a terminal. The third bump B3 illustrated in FIG. 4 may be set as a no connection (NC) bump.

The first pixel controller 121 may generate and output a pixel enable signal PE, a touch enable signal SE, and a clock transfer signal CTS according to a predetermined pixel driving timing and a predetermined sensing timing, based on the reference clock RCLK input through the fourth bump B4 from the first clock transfer line CTL1 of the second pixel driving line group LG2. Also, the first pixel controller 121 may transfer the reference clock RCLK, input through the fourth bump B4, to the first pixel driving circuit 122 and the touch sensing circuit 123.

The first pixel driving circuit 122 may be enabled by the pixel enable signal PE input from the first pixel controller 121 and may output a data current Idata corresponding to the digital pixel data Pdata, based on the reference clock RCLK, the digital pixel data Pdata, the pixel driving voltage Vdd, and a cathode voltage Vss. In this case, the reference clock RCLK may be transferred from the first pixel controller 121. The digital pixel data Pdata may be input through the second bump B2 from the first pixel data transfer line DTL1 of the second pixel driving line group LG2. The pixel driving voltage Vdd may be input through the sixth bump B6 from the pixel driving power line PPL of the second pixel driving line group LG2. The cathode voltage Vss may be input through the fifth bump B5. The data current Idata output from the first pixel driving circuit 122 may be supplied to the light emission part ELP through the eighth bump B8.

Moreover, the first pixel driving circuit 122 may buffer the digital pixel data Pdata input through the second bump B2, and the buffered digital pixel data Pdata may be output to the second pixel data transfer line DTL2 of the second pixel driving line group LG2 through the ninth bump B9 and may be transferred to the normal driving pixel NDP disposed at a next stage, thereby preventing the voltage drop (IR drop) of the digital pixel data Pdata.

The touch sensing circuit 123 may be electrically connected to the touch electrode TE through the eleventh bump B11 and may be supplied with a precharging voltage Vpre through the twelfth bump B12. The touch sensing circuit 123 may be enabled by the touch enable signal SE input from the first pixel controller 121, may supply the precharging voltage Vpre supplied through the twelfth bump B12 to the touch electrode TE through the eleventh bump B11 based on the reference clock RCLK, and then may sense a capacitance variation value of the touch electrode TE to generate and output touch presence data TDD. In this case, the precharging voltage Vpre may not be input from the outside but may be changed to the pixel driving voltage Vdd supplied through the sixth bump B6 or may be supplied from the first pixel driving circuit 122. In this case, the twelfth bump B12 may be set as an NC bump, and thus, a precharging voltage line which is disposed on the substrate for supplying the precharging voltage Vpre may be removed.

The touch sensing circuit 123 may output the touch presence data TDD, transferred through the tenth bump B10 via the normal driving pixel NDP disposed at a next stage, to the data driving circuit unit through the first bump B1 according to the reference clock RCLK, based on the touch enable signal SE.

The first clock transfer circuit 124 may selectively connect the fourth bump B4 to the seventh bump B7 according to the clock transfer signal CTS supplied from the first pixel controller 121. For example, during a clock blocking period corresponding to a period in which the first pixel driving chip 120 receives and processes the digital pixel data, the first clock transfer circuit 124 may be turned off according to the clock transfer signal CTS having a first logic state supplied from the first pixel controller 121 and may electrically disconnect the fourth bump B4 from the seventh bump B7. Also, during the other period except the clock blocking period, the first clock transfer circuit 124 may be turned on according to the clock transfer signal CTS having a second logic state supplied from the first pixel controller 121 and may output the reference clock RCLK, input through the fourth bump B4, to the seventh bump B7. The reference clock RCLK output to the seventh bump B7 may be transferred to a normal driving pixel NDP disposed at a next stage through the second clock transfer line CTL2 of the second pixel driving line group LG2.

The first clock transfer circuit 124 according to an aspect may include a first switch. The first switch may include a gate terminal receiving the clock transfer signal CTS supplied from the first pixel controller 121, a first source/drain terminal connected to the fourth bump B4, and a second source/drain terminal connected to the seventh bump B7. In this case, the first and second source/drain terminals of the first switch may act as a source terminal or a drain terminal, based on a direction of a current.

The first pixel driving chip 120 according to an aspect may further include a first buffer circuit 125. The first buffer circuit 125 may buffer the reference clock RCLK input through the first clock transfer circuit 124 and may output the buffered reference clock RCLK to the seventh bump B7. The first buffer circuit 125 according to an aspect may include an inverter type buffer and may include an even number of inverters serially connected between an output terminal of the first clock transfer circuit 124 and the seventh bump B7. For example, the first buffer circuit 125 may buffer the reference clock RCLK input through the first clock transfer circuit 124 by using the pixel driving voltage Vdd input through the sixth bump B6 and the cathode voltage Vss input through the fifth bump B5 and may output the buffered reference clock RCLK to the seventh bump B7, thereby preventing the voltage drop (IR drop) of the reference clock RCLK.

The light emission part ELP may emit light with a data current Idata supplied from the first pixel driving chip 120. The light emitted from the light emission part ELP may be output to the outside through the opposite substrate 190, or may be output to the outside through the substrate 110.

The light emission part ELP according to an aspect may include an anode electrode (or a first electrode) connected to the eighth bump B8 of the first pixel driving chip 120, a light emitting layer connected to the anode electrode, and a cathode electrode (or a second electrode) CE connected to the light emitting layer. The light emitting layer may include one of an organic light emitting layer, an inorganic light emitting layer, and a quantum dot light emitting layer, or may include a stacked or mixed structure including the organic light emitting layer (or the inorganic light emitting layer) and the quantum dot light emitting layer.

Figure 5:
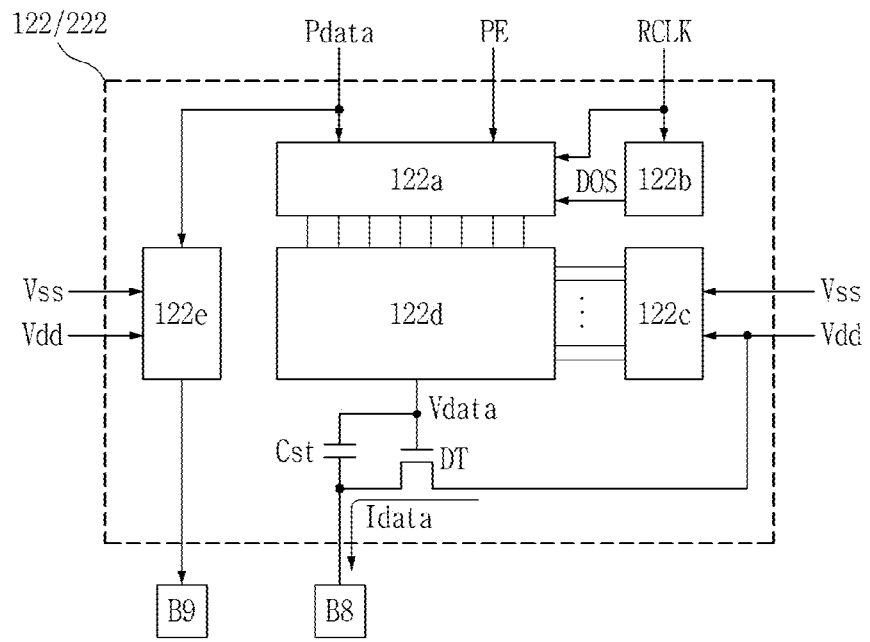
FIG. 5 is a diagram illustrating a first pixel driving circuit according to an aspect of the present disclosure illustrated in FIG. 4.

FIG. 5 is a diagram illustrating a first pixel driving circuit 122 according to an aspect of the present disclosure illustrated in FIG. 4.

Referring to FIGS. 4 and 5, the first pixel driving circuit 122 according to an aspect of the present disclosure may include a data parallelization circuit 122a, a clock counter 122b, a grayscale voltage generator 122c, a grayscale voltage selector 122d, a driving transistor DT, and a capacitor Cst.

The data parallelization circuit 122a may be enabled according to the pixel enable signal PE and may receive and parallelize the digital pixel data Pdata which is input in a serial data communication manner, based on the reference clock RCLK. Also, the data parallelization circuit 122a may simultaneously output parallel digital pixel data according to a parallel data output signal DOS.

The clock counter 122b may count the reference clock RCLK based on a predetermined pixel operation timing to generate the parallel data output signal DOS, thereby controlling a data output of the data parallelization circuit 122a.

The grayscale voltage generator 122c may divide a voltage between the pixel driving voltage Vdd and the cathode voltage Vss to generate a plurality of grayscale voltages respectively corresponding to a plurality of grayscale values based on the number of bits of the digital pixel data.

The grayscale voltage selector 122d may select, as a data voltage Vdata, one grayscale voltage corresponding to a grayscale value of the parallel digital pixel data Pdata from among the plurality of grayscale voltages supplied from the grayscale voltage generator 122c and may output analog data voltage Vdata, thereby converting the digital pixel data Pdata into the analog data voltage Vdata. The grayscale voltage generator 122c and the grayscale voltage selector 122d may be referred to as a digital-to-analog converter part.

The driving transistor DT may include a gate electrode receiving the data voltage Vdata from the grayscale voltage selector 122d, a source electrode connected to the anode electrode of the light emission part ELP through the eighth bump B8, and a drain electrode receiving the pixel driving voltage Vdd input through the sixth bump B6. The driving transistor DT may control the data current Idata which flows from a pixel driving voltage Vdd source to the light emission part ELP through the eighth bump B8, based on the data voltage Vdata input thereto, thereby controlling light emission of the light emission part ELP.

The capacitor Cst may be connected between the gate electrode and the source electrode of the driving transistor DT. The capacitor Cst may store a voltage corresponding to the data voltage Vdata supplied to the gate electrode of the driving transistor DT and may turn on the driving transistor DT with the stored voltage.

The first pixel driving circuit 122 according to an aspect of the present disclosure may further include a buffer 122e. The buffer 122e may buffer the digital pixel data Pdata input thereto and may output the buffered digital pixel data Pdata to the ninth bump B9. The buffer 122e according to an aspect may be an inverter type buffer and may include an even number of inverters serially connected between a data input terminal of the first pixel driving circuit 122 and the ninth bump B9. For example, the buffer 122e may buffer the digital pixel data Pdata input thereto by using the pixel driving voltage Vdd input through the sixth bump B6 and the cathode voltage Vss input through the fifth bump B5 and may output the buffered digital pixel data Pdata to the ninth bump B9, thereby preventing the voltage drop (IR drop) of the digital pixel data Pdata.

Figure 6:
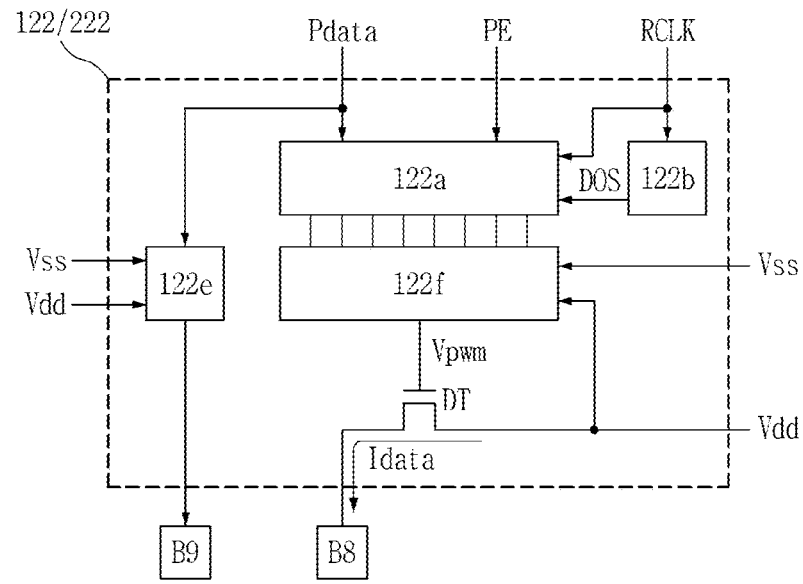
FIG. 6 is a diagram illustrating a first pixel driving circuit according to another aspect of the present disclosure illustrated in FIG. 4.

FIG. 6 is a diagram illustrating a first pixel driving circuit 122 according to another aspect of the present disclosure illustrated in FIG. 4.

Referring to FIGS. 4 and 6, the first pixel driving circuit 122 according to another aspect of the present disclosure may include a data parallelization circuit 122a, a clock counter 122b, a duty controller 122f, and a driving transistor DT.

The data parallelization circuit 122a may be enabled according to the pixel enable signal PE and may receive and parallelize the digital pixel data Pdata which is input in the serial data communication manner, based on the reference clock RCLK. Also, the data parallelization circuit 122a may simultaneously output parallel digital pixel data according to a parallel data output signal DOS.

The clock counter 122b may count the reference clock RCLK based on a predetermined pixel operation timing to generate the parallel data output signal DOS, thereby controlling a data output of the data parallelization circuit 122a.

The duty controller 122f may generate and output a pulse width modulation signal Vpwm for controlling a turn-on time of the driving transistor DT in one frame, based on a grayscale value of the parallel digital pixel data Pdata supplied from the data parallelization circuit 122a. The duty controller 122f according to an aspect may generate the pulse width modulation signal Vpwm having a duty on period corresponding to the grayscale value of the parallel digital pixel data Pdata, based on 100% duty which is set as a whole emission period in one frame. For example, when the grayscale value of the parallel digital pixel data Pdata input to the duty controller 122f has a grayscale value "511"

with respect to 10-bit digital pixel data Pdata, the duty controller 122f may generate the pulse width modulation signal Vpwm having the duty on period of 22%, but is not limited thereto. In other aspects, the duty on period may be changed based on the number of bits of the digital pixel data Pdata, a luminance of the display apparatus, or a frame time.

The driving transistor DT may include a gate electrode receiving the pulse width modulation signal Vpwm from the duty controller 122f, a source electrode connected to the anode electrode of the light emission part ELP through the eighth bump B8, and a drain electrode receiving the pixel driving voltage Vdd input through the sixth bump B6. The driving transistor DT may be turned on during the duty on period corresponding to the pulse width modulation signal Vpwm input thereto and may control the data current Idata which flows from a pixel driving voltage Vdd source to the light emission part ELP through the eighth bump B8, thereby controlling light emission of the light emission part ELP. In this case, the pixel driving voltage Vdd may have a voltage level corresponding to a maximum grayscale value of the digital pixel data, and for example, may have a voltage level corresponding to a white grayscale value.

The first pixel driving circuit 122 according to another aspect of the present disclosure may further include a buffer 122e which buffers the digital pixel data Pdata input thereto and outputs the buffered pixel data Pdata to the ninth bump B9.

Figure 7:
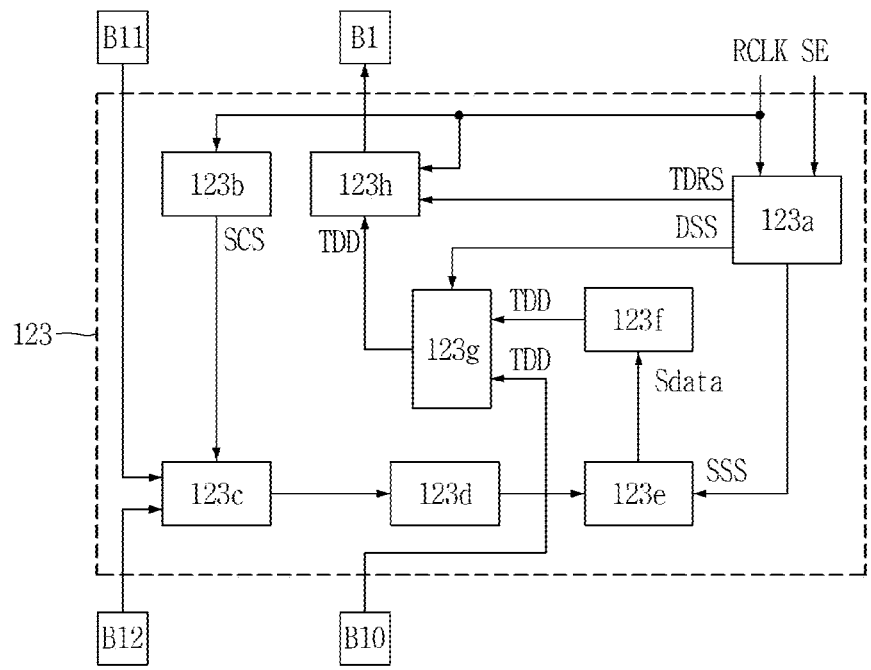
FIG. 7 is a diagram illustrating a touch sensing circuit according to an aspect of the present disclosure illustrated in FIG. 4.

FIG. 7 is a diagram illustrating a touch sensing circuit 123 according to an aspect of the present disclosure illustrated in FIG. 4.

Referring to FIGS. 4 and 7, the touch sensing circuit 123 according to an aspect of the present disclosure may include a sensing timing control circuit 123a, a switching controller 123b, a switching unit 123c, a sensing integral circuit 123d, an analog-to-digital conversion circuit 123e, a comparison circuit 123f, a selection circuit 123g, and a first-in-first-out (FIFO) memory 123h.

The sensing timing control circuit 123a may be enabled by the touch enable signal SE and may generate a sensing sampling signal SSS, a data selection signal DSS, and a touch data report signal TDRS, based on the reference clock RCLK input thereto. For example, when the sensing timing control circuit 123a is enabled by the touch enable signal SE, the sensing timing control circuit 123a may count the reference clock RCLK according to a counting number based on a predetermined sensing timing to generate the sensing sampling signal SSS, the data selection signal DSS, and the touch data report signal TDRS. In this case, the sensing sampling signal SSS may be generated in a vertical blank period between a frame and another frame.

The switching controller 123b may generate a sensing switch control signal SCS for repeating precharging and discharging of a touch electrode TE or for connecting the touch electrode TE to the sensing integral circuit 123d, based on the reference clock RCLK input thereto.

In response to the sensing switch control signal SCS, the switching unit 123c may supply the precharging voltage Vpre to the touch electrode TE connected through the eleventh bump B11 of the first pixel driving chip 120 to precharge a capacitance of a touch sensor and may connect a corresponding precharged touch electrode TE to the sensing integral circuit 123d. In this case, the switching unit 123c may receive the pixel driving voltage and may use the pixel driving voltage as the precharging voltage Vpre.

The sensing integral circuit 123d may be selectively connected to a corresponding touch electrode TE according to switching of the switching unit 123c and may accumulate a capacitance variation value of the touch electrode TE into a sensing capacitor at least once or more.

In response to the sensing sampling signal SSS, the analog-to-digital conversion circuit 123e may convert a capacitance value, accumulated into the sensing capacitor, into digital sensing data Sdata and may output the digital sensing data Sdata.

The comparison circuit 123f may compare reference data with the digital sensing data Sdata supplied from the analog-to-digital conversion circuit 123e to generate touch presence data TDD. For example, when the digital sensing data Sdata is less than the reference data, the comparison circuit 123f may generate the touch presence data TDD having a digital value "0", and when the digital sensing data Sdata is equal to or greater than the reference data, the comparison circuit 123f may generate the touch presence data TDD having a digital value "1". In this case, the touch presence data TDD may be 1-bit digital data.

The selection circuit 123g may select and output the touch presence data TDD supplied from the comparison circuit 123f and touch presence data TDD transferred through the second sensing data transfer line STL2 of the second pixel driving line group LG2 via a next stage normal driving pixel NDP, based on the data selection signal DSS. For example, the selection circuit 123g may include a control terminal receiving the data selection signal DSS, a first input terminal connected to an output terminal of the comparison circuit 123f, a second input terminal connected to the second sensing data transfer line STL2 of the second pixel driving line group LG2 through the tenth bump B10, and a output terminal connected to the FIFO memory 123h. The selection circuit 123g may output the touch presence data TDD input from the comparison circuit 123f through the first input terminal according to the data selection signal DSS having a first logic state and may output the touch presence data TDD transferred via the next stage normal driving pixel NDP through the second input terminal according to the data selection signal DSS having a second logic state.

The FIFO memory 123h may store the touch presence data TDD supplied from the selection circuit 123g by using a FIFO manner, based on the reference clock RCLK input thereto and may output the stored touch presence data TDD by using the FIFO manner, based on the touch data report signal TDRS. The touch presence data TDD output from the FIFO memory 123h may be transferred to the data driving circuit unit through the first bump B1 of the first pixel driving chip 120 and the first sensing data transfer line STL1 of the second pixel driving line group LG2.

Additionally, the touch sensing circuit 123 according to an aspect of the present disclosure may further include a buffer circuit connected between the FIFO memory 123h and the first bump B1. The buffer circuit may include an inverter type buffer and may include an even number of inverters serially connected between an output terminal of the FIFO memory 123h and the first bump B1. The buffer circuit may buffer the touch presence data TDD output from the FIFO memory 123h and may output the buffered touch presence data TDD to the first bump B1, thereby preventing the voltage drop (IR drop) of the touch presence data TDD.

Figure 8:
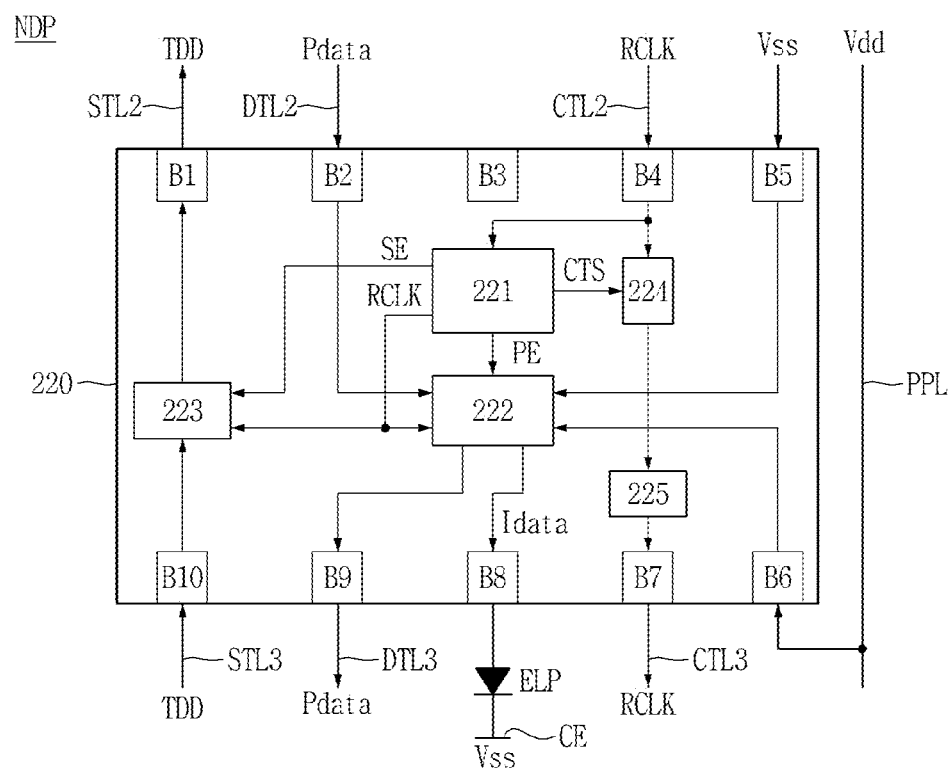
FIG. 8 is a diagram illustrating a normal driving pixel according to an aspect of the present disclosure illustrated in FIG. 3.

FIG. 8 is a diagram illustrating a normal driving pixel NDP according to an aspect of the present disclosure illustrated in FIG. 3 and illustrates a normal driving pixel disposed at a front stage with respect to a first sensing driving pixel illustrated in FIG. 3.

Referring to FIG. 8, the normal driving pixel NDP according to an aspect of the present disclosure may include a second pixel driving chip 220 and a light emission part ELP.

The second pixel driving chip 220 may be a minimum-unit microchip or one chipset and may be a semiconductor packaging device which includes two or more transistors and one or more capacitors and has a fine size. The second pixel driving chip 220 may be provided in a predetermined normal pixel area of the plurality of pixel areas. The second pixel driving chip 220 may allow the light emission part ELP to emit light, based on a reference clock RCLK, digital pixel data Pdata, and a pixel driving voltage Vdd input thereto and may again transfer touch presence data, transferred from a next stage normal driving pixel NDP through a sensing data transfer line SRL, to a normal driving pixel NDP provided at a front stage.

The second pixel driving chip 220 according to an aspect may include first to tenth bumps B1 to B10, a second pixel controller 221, a second pixel driving circuit 222, a touch data transfer circuit 223, and a clock transfer circuit 224.

The second pixel controller 221 may generate and output a pixel enable signal PE, a touch enable signal SE, and a clock transfer signal CTS according to a predetermined pixel driving timing and a predetermined sensing timing, based on a reference clock RCLK input through the fourth bump B4 from the second clock transfer line CTL2 of the second pixel driving line group LG2. Also, the second pixel controller 221 may transfer the reference clock RCLK, input through the fourth bump B4, to the second pixel driving circuit 222 and the touch data transfer circuit 223.

The second pixel driving circuit 222 may be enabled by the pixel enable signal PE input from the second pixel controller 221 and may output a data current Idata corresponding to digital pixel data Pdata, based on the reference clock RCLK, the digital pixel data Pdata, a pixel driving voltage Vdd, and a cathode voltage Vss. In this case, the reference clock RCLK may be transferred from the second pixel controller 221. The digital pixel data Pdata may be input through the second bump B2 from the second pixel data transfer line DTL2 of the second pixel driving line group LG2. The pixel driving voltage Vdd may be input through the sixth bump B6 from the pixel driving power line PPL of the second pixel driving line group LG2. The cathode voltage Vss may be input through the fifth bump B5. The data current Idata output from the second pixel driving circuit 222 may be supplied to the light emission part ELP through the eighth bump B8. The digital pixel data Pdata input through the second bump B2 may be supplied to the second pixel driving circuit 222, output to the second pixel data transfer line DTL2 of the second pixel driving line group LG2 through the ninth bump B9, and transferred to a normal driving pixel NDP disposed at a next stage.

The second pixel driving circuit 222 according to an aspect of the present disclosure has substantially the same configuration as that of the first pixel driving circuit 122 illustrated in FIG. 5 or 6, and thus, its repeating description will be omitted.

The touch data transfer circuit 223 may output touch presence data TDD, transferred via a next stage normal driving pixel NDP through the tenth bump B10, to a data driving circuit through the first bump B1 according to the reference clock RCLK, based on the touch enable signal SE.

The touch data transfer circuit 223 according to an aspect may include a touch data report signal generator and a FIFO memory.

When the touch data report signal generator is enabled by the touch enable signal SE, the touch data report signal generator may count the reference clock RCLK according to a counting number based on a predetermined sensing timing to generate a touch data report signal.

The FIFO memory may store the touch presence data TDD transferred via the next stage normal driving pixel NDP through the tenth bump B10 by using the FIFO manner, based on the reference clock RCLK input thereto and may output the stored touch presence data TDD by using the FIFO manner, based on the touch data report signal. The touch presence data TDD output from the FIFO memory may be transferred to a data driving circuit through the first bump B1 of the second pixel driving chip 220, the second sensing data transfer line STL2 of the second pixel driving line group LG2, the first pixel driving chip 120 of the sensing driving pixel SDP disposed at the front stage, and the first sensing data transfer line STL1 of the second pixel driving line group LG2.

The second clock transfer circuit 224 may selectively connect the fourth bump B4 to the seventh bump B7 according to the clock transfer signal CTS supplied from the second pixel controller 221. For example, during a clock blocking period corresponding to a period in which the second pixel driving chip 220 receives and processes the digital pixel data, the second clock transfer circuit 224 may be turned off according to the clock transfer signal CTS having a first logic state supplied from the second pixel controller 221 and may electrically disconnect the fourth bump B4 from the seventh bump B7. Also, during the other period except the clock blocking period, the second clock transfer circuit 224 may be turned on according to the clock transfer signal CTS having a second logic state supplied from the second pixel controller 221 and may output the reference clock RCLK, input through the fourth bump B4, to the seventh bump B7. The reference clock RCLK output to the seventh bump B7 may be transferred to a normal driving pixel NDP disposed at a next stage through the third clock transfer line CTL3 of the second pixel driving line group LG2.

The second clock transfer circuit 224 according to an aspect may include a second switch. The second switch may include a gate terminal receiving the clock transfer signal CTS supplied from the second pixel controller 221, a first source/drain terminal connected to the fourth bump B4, and a second source/drain terminal connected to the seventh bump B7. In this case, the first and second source/drain terminals of the second switch may act as a source terminal or a drain terminal, based on a direction of a current.

The second pixel driving chip 220 according to an aspect may further include a second buffer circuit 225. The second buffer circuit 225 may buffer the reference clock RCLK input through the second clock transfer circuit 224 and may output the buffered reference clock RCLK to the seventh bump B7. The second buffer circuit 225 according to an aspect may include an inverter type buffer and may include an even number of inverters serially connected between an output terminal of the second clock transfer circuit 224 and the seventh bump B7. For example, the second buffer circuit 225 may buffer the reference clock RCLK input through the second clock transfer circuit 224 by using the pixel driving voltage Vdd input through the sixth bump B6 and the cathode voltage Vss input through the fifth bump B5 and may output the buffered reference clock RCLK to the seventh bump B7, thereby preventing the voltage drop (IR drop) of the reference clock RCLK.

The light emission part ELP may emit light with a data current Idata supplied from the second pixel driving chip 220. The light emitted from the light emission part ELP may be output to the outside through the opposite substrate 190, or may be output to the outside through the substrate 110.

The light emission part ELP according to an aspect may include an anode electrode (or a first electrode) connected to the eighth bump B8 of the second pixel driving chip 220, a light emitting layer connected to the anode electrode, and a cathode electrode (or a second electrode) CE connected to the light emitting layer. The light emitting layer may include one of an organic light emitting layer, an inorganic light emitting layer, and a quantum dot light emitting layer, or may include a stacked or mixed structure including the organic light emitting layer (or the inorganic light emitting layer) and the quantum dot light emitting layer.

Figure 9:
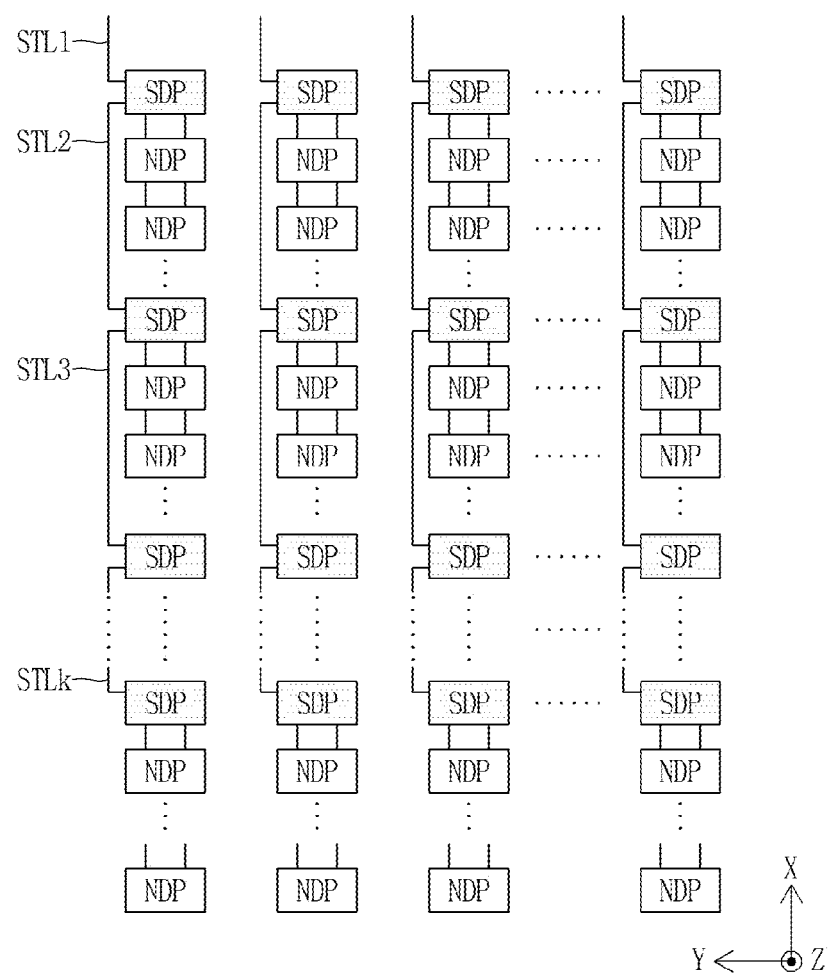
FIG. 9 is a diagram illustrating another aspect of first to $k^{th}$ sensing data lines of a pixel driving line group illustrated in FIG. 3.

FIG. 9 is a diagram illustrating another aspect of first to $k^{th}$ sensing data lines of a pixel driving line group illustrated in FIG. 3.

Referring to FIG. 9, each of first to $k^{th}$ sensing data transfer lines STL1 to STLk of a pixel driving line group according to another aspect may be electrically connected between adjacent sensing driving pixels SDP of a plurality of sensing driving pixels SDP arranged in a first direction X. That is, each of the first to $k^{th}$ sensing data transfer lines STL1 to STLk may be connected in cascade between adjacent sensing driving pixels SDP of the plurality of sensing driving pixels SDP so as to more quickly transfer touch presence data TDD generated by a first pixel driving chip 120 of each of the plurality of sensing driving pixels SDP, and thus, may be electrically connected between two sensing driving pixels SDP adjacent to each other in the first direction X. During a touch data reporting period, the first to $k^{th}$ sensing data transfer lines STL1 to STLk may sequentially transfer one piece of touch presence data to the plurality of sensing driving pixels SDP in the order from a last sensing driving pixel to a first sensing driving pixel of the plurality of sensing driving pixels SDP arranged in the first direction X by using the cascade manner, based on a reference clock, thereby reducing a touch data reporting time.

Figure 10:
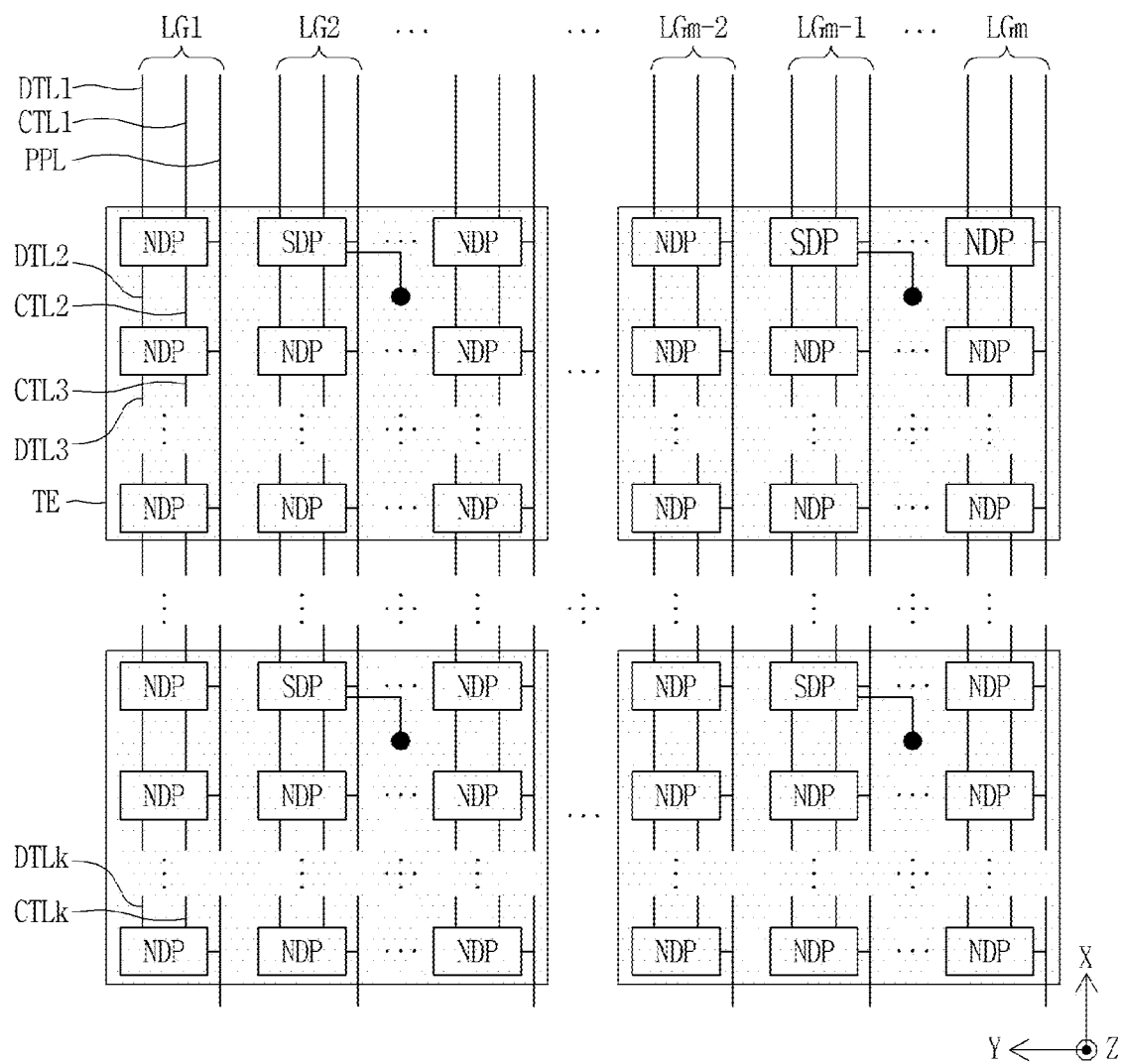
FIG. 10 is a diagram illustrating a disposition structure of a touch electrode, a sensing driving pixel, and a normal driving pixel according to another aspect illustrated in FIG. 2.

FIG. 10 is a diagram illustrating a disposition structure of a touch electrode, a sensing driving pixel, and a normal driving pixel according to another aspect illustrated in FIG. 2.

Referring to FIG. 10, first to $m^{th}$ pixel driving line groups LG1 to LGm according to the present aspect may each be disposed between adjacent pixels of pixels NDP and SDP arranged in the first direction X and may sequentially transfer a signal between pixels NDP and SDP adjacent to each other by using the cascade manner.

Each of the first to $m^{th}$ pixel driving line groups LG1 to LGm according to an aspect may include first to $k^{th}$ pixel data transfer lines DTL1 to DTLk, first to $k^{th}$ clock transfer lines CTL1 to CTLk, and a pixel driving power line PPL. Except for that first to $k^{th}$ sensing data transfer lines are removed from each of the first to $m^{th}$ pixel driving line groups LG1 to LGm illustrated in FIG. 3, the first to $m^{th}$ pixel driving line groups LG1 to LGm according to the present aspect are substantially the same as the first to $m^{th}$ pixel driving line groups LG1 to LGm illustrated in FIG. 3, and thus, their repeating descriptions will be omitted.

The first to $k^{th}$ pixel data transfer lines DTL1 to DTLk of each of the first to $m^{th}$ pixel driving line groups LG1 to LGm according to the present aspect may be used to transfer digital pixel data to a plurality of sensing driving pixels SDP and a plurality of normal driving pixels NDP arranged in the first direction X by using the cascade manner, and moreover, may be used to transfer touch presence data generated by the sensing driving pixels SDP by using the cascade manner. Therefore, in the present aspect, the number of lines disposed on a substrate, the number of terminals (or pins) of sensing driving pixels SDP, and the number of terminals (or pins) of normal driving pixels NDP are reduced.

Figure 11:
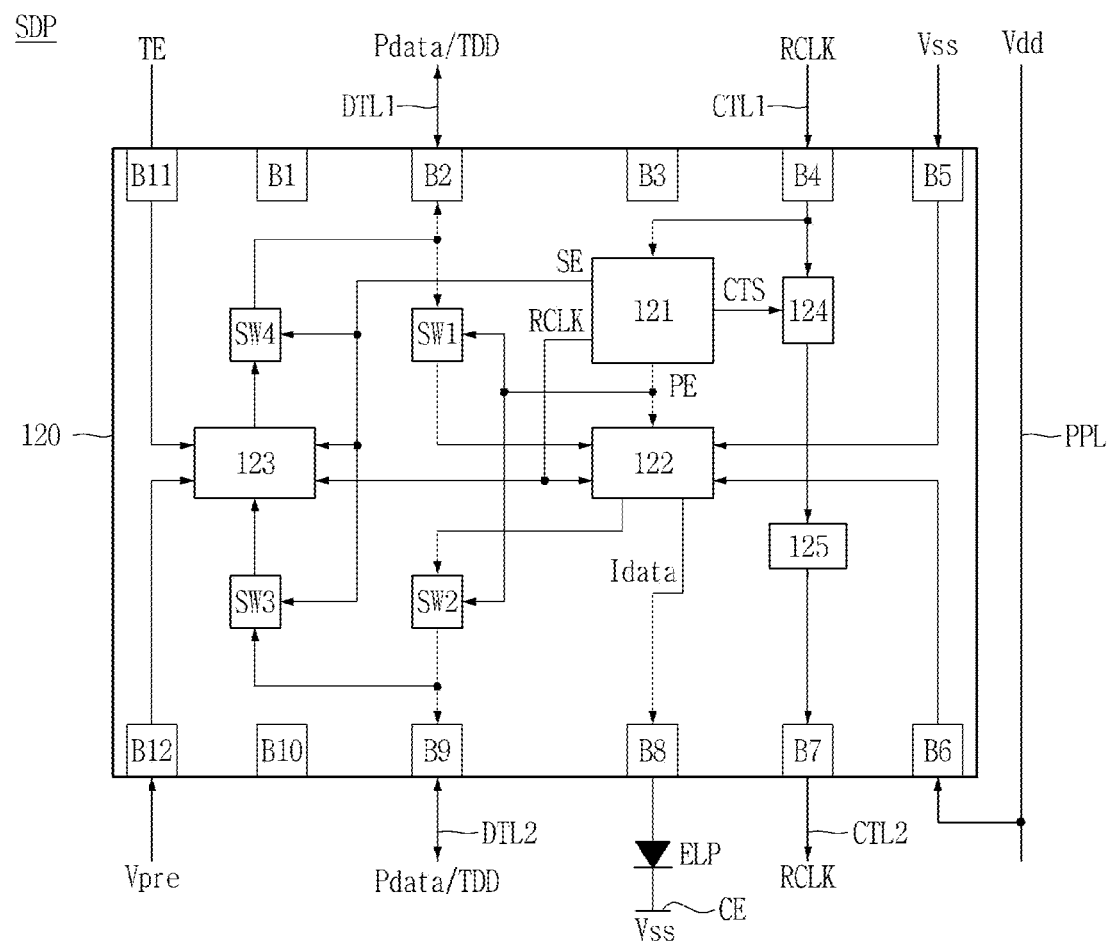
FIG. 11 is a diagram illustrating a sensing driving pixel according to an aspect of the present disclosure illustrated in FIG. 10.

FIG. 11 is a diagram illustrating a sensing driving pixel SDP according to an aspect of the present disclosure illustrated in FIG. 10 and illustrates a sensing driving pixel connected to the touch electrode TE illustrated in FIG. 10.

Referring to FIG. 11, the sensing driving pixel SDP according to another aspect of the present disclosure may include a first pixel driving chip 120 and a light emission part ELP.

The first pixel driving chip 120 according to an aspect may include first to twelfth bumps B1 to B12, a first pixel controller 121, a first pixel driving circuit 122, a touch sensing circuit 123, a first clock transfer circuit 124, and first to fourth switching elements SW1 to SW4. Since a sensing data transfer line is removed, the sensing driving pixel SDP having such a configuration may be implemented by changing the bumps B2 and B9, through which digital pixel data Pdata is input/output, to a common bump for transferring touch presence data generated by the touch sensing circuit 123. To this end, the first pixel driving chip 120 may further include the first to fourth switching elements SW1 to SW4, and since the second bump B2 and the ninth bump B9 are changed to the common bump, each of the first, third, and tenth bumps B1, B3, and B10 may be set as an NC bump.

Except for that the digital pixel data Pdata is transferred through the first and second switching elements SW1 and SW2 and touch presence data TDD is transferred through the third and fourth switching elements SW3 and SW4, the sensing driving pixel SDP according to the present aspect is the same as the sensing driving pixel SDP illustrated in FIG. 4. Hereinafter, therefore, only elements relevant to the first to fourth switching elements SW1 to SW4 will be described.

First, in order to control the turn-on/off (or switching) of the first to fourth switching elements SW1 to SW4, the first pixel controller 121 may count a reference clock RCLK to generate a pixel enable signal PE and a touch enable signal SE which are alternately provided by units of one frame. For example, the first pixel controller 121 may generate the pixel enable signal PE during an odd-numbered frame and may generate the touch enable signal SE during an even-numbered frame. As another example, the first pixel controller 121 may generate the pixel enable signal PE during a first sub-frame of one frame and may generate the touch enable signal SE during a second sub-frame of the one frame. In this case, in the one frame, a period of the first sub-frame may be the same as or different from that of the second sub-frame. For example, since the number of horizontal lines for displaying an image is relatively larger than the number of horizontal lines where touch electrodes are disposed, the period of the first sub-frame may be longer than that of the second sub-frame.

The first switching element SW1 may be connected between the second bump B2 and a data input terminal of the first pixel driving circuit 122 and may be turned on based on the pixel enable signal PE to transfer the digital pixel data Pdata, input through the second bump B2, to the first pixel driving circuit 122. Therefore, the first pixel driving circuit 122 may generate a data current Idata based on the digital pixel data Pdata input through the first switching element SW1 and may supply the data current Idata to the light emission part ELP through the eighth bump B8.

The second switching element SW2 may be connected between the ninth bump B9 and a data output terminal of the first pixel driving circuit 122 and may be turned on based on the pixel enable signal PE to transfer the digital pixel data Pdata, input via the first pixel driving circuit 122, to the ninth bump B9.

The third switching element SW3 may be connected between the ninth bump B9 and a data input terminal of the touch sensing circuit 123 and may be turned on based on the touch enable signal SE to transfer the touch presence data TDD, input through the ninth bump B9, to the touch sensing circuit 123.

The fourth switching element SW4 may be connected between the second bump B2 and a data output terminal of the touch sensing circuit 123 and may be turned on based on the touch enable signal SE to transfer the touch presence data TDD, input via the touch sensing circuit 123, to the second bump B2.

Except for that the digital pixel data Pdata is transferred through the first and second switching elements SW1 and SW2, the first pixel driving circuit 122 according to the present aspect is substantially the same as the first pixel driving circuit 122 illustrated in FIG. 5 or 6, and thus, its repeating description will be omitted.

Except for that touch presence data TDD is transferred through the third and fourth switching elements SW3 and SW4, the touch sensing circuit 123 according to the present aspect is substantially the same as the touch sensing circuit 123 illustrated in FIG. 7, and thus, its repeating description will be omitted.

Figure 12:
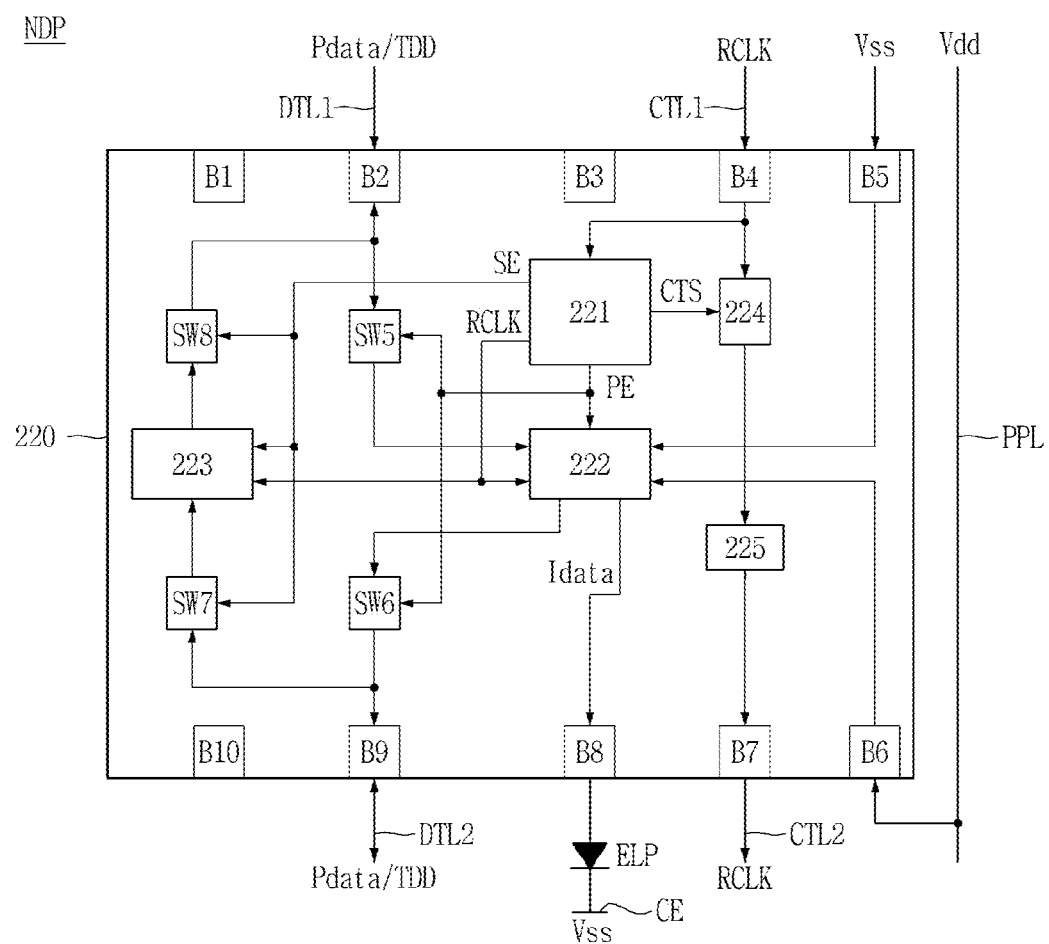
FIG. 12 is a diagram illustrating a normal driving pixel according to an aspect of the present disclosure illustrated in FIG. 10.

FIG. 12 is a diagram illustrating a normal driving pixel NDP according to an aspect of the present disclosure illustrated in FIG. 10 and illustrates a normal driving pixel disposed at a front stage with respect to a first sensing driving pixel illustrated in FIG. 10.

Referring to FIG. 12, the normal driving pixel NDP according to an aspect of the present disclosure may include a second pixel driving chip 220 and a light emission part ELP.

The second pixel driving chip 220 according to an aspect may include first to tenth bumps B1 to B10, a second pixel controller 221, a second pixel driving circuit 222, a touch data transfer circuit 223, a clock transfer circuit 224, and fifth to eighth switching elements SW5 to SW8. Since a sensing data transfer line is removed, the normal driving pixel NDP having such a configuration may be implemented by changing the bumps B2 and B9, through which digital pixel data Pdata is input/output, to a common bump for transferring touch presence data transferred from the touch data transfer circuit 223. To this end, the second pixel driving chip 220 may further include the fifth to eighth switching elements SW5 to SW8, and since the second bump B2 and the ninth bump B9 are changed to the common bump, each of the first, third, and tenth bumps B1, B3, and B10 may be set as an NC bump.

Except for that the digital pixel data Pdata is transferred through the fifth and sixth switching elements SW5 and SW6 and touch presence data TDD is transferred through the seventh and eighth switching elements SW7 and SW8, the normal driving pixel NDP according to the present aspect is the same as the normal driving pixel NDP illustrated in FIG. 8. Hereinafter, therefore, only elements relevant to the fifth to eighth switching elements SW5 to SW8 will be described.

First, in order to control the turn-on/off (or switching) of the fifth and sixth switching elements SW5 and SW6, the second pixel controller 221 may count a reference clock RCLK to generate a pixel enable signal PE and a touch enable signal SE which are alternately provided by units of one frame. For example, the second pixel controller 221 may generate the pixel enable signal PE and the touch enable signal SE identically to the first pixel controller 121.

The fifth switching element SW5 may be connected between the second bump B2 and a data input terminal of the second pixel driving circuit 222 and may be turned on based on the pixel enable signal PE to transfer the digital pixel data Pdata, input through the second bump B2, to the second pixel driving circuit 222. Therefore, the second pixel driving circuit 222 may generate a data current Idata based on the digital pixel data Pdata input through the fifth switching element SW5 and may supply the data current Idata to the light emission part ELP through the eighth bump B8.

The sixth switching element SW6 may be connected between the ninth bump B9 and a data output terminal of the second pixel driving circuit 222 and may be turned on based on the pixel enable signal PE to transfer the digital pixel data Pdata, input via the second pixel driving circuit 222, to the ninth bump B9.

The seventh switching element SW7 may be connected between the ninth bump B9 and a data input terminal of the touch data transfer circuit 223 and may be turned on based on the touch enable signal SE to transfer the touch presence data TDD, input through the ninth bump B9, to the touch data transfer circuit 223.

The eighth switching element SW8 may be connected between the second bump B2 and a data output terminal of the touch data transfer circuit 223 and may be turned on based on the touch enable signal SE to transfer the touch presence data TDD, input via the touch data transfer circuit 223, to the second bump B2.

Except for that the digital pixel data Pdata is transferred through the fifth and sixth switching elements SW5 and SW6, the second pixel driving circuit 222 according to the present aspect is substantially the same as the first pixel driving circuit 122 illustrated in FIG. 5 or 6, and thus, its repeating description will be omitted.

Except for that touch presence data TDD is transferred through the seventh and eighth switching elements SW7 and SW8, the touch data transfer circuit 223 according to the present aspect is substantially the same as the touch sensing circuit 123 illustrated in FIG. 7, and thus, its repeating description will be omitted.

A display apparatus including the normal driving pixel NDP according to another aspect of the present disclosure may be configured in order for the second pixel driving circuit 222 and the touch data transfer circuit 223 to share the pixel data transfer lines DTL1 to DTLk, and thus, the number of lines disposed on a substrate and the number of terminals (or pins) of normal driving pixels NDP are reduced.

Figure 13:
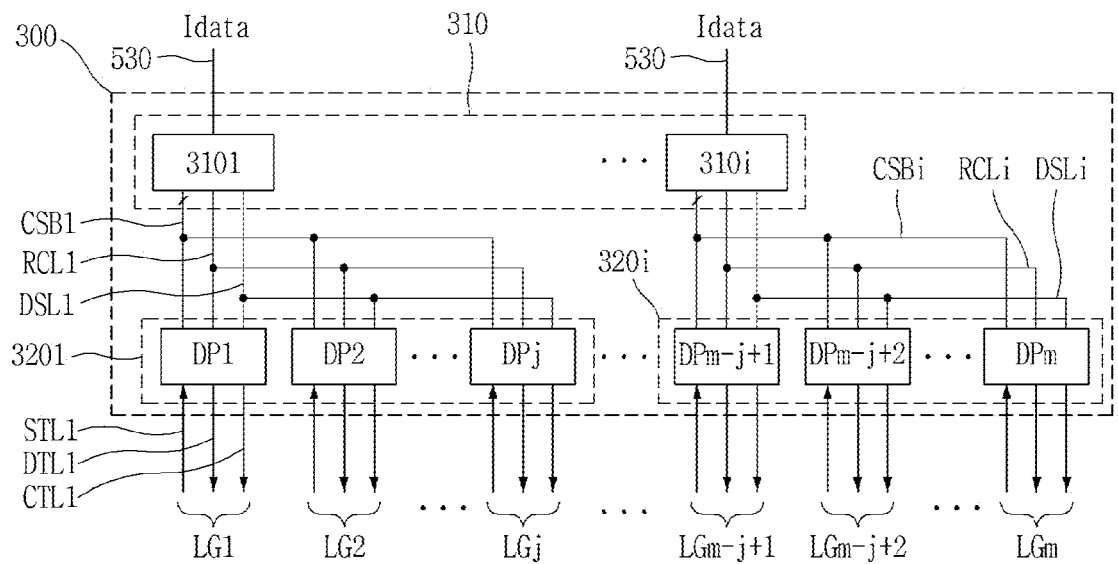
FIG. 13 is a diagram illustrating a data driving circuit unit according to an aspect of the present disclosure illustrated in FIGS. 1 and 2.

FIG. 13 is a diagram illustrating a data driving circuit unit 300 according to an aspect of the present disclosure illustrated in FIGS. 1 and 2.

Referring to FIGS. 1, 2, and 13, the data driving circuit unit 300 according to an aspect of the present disclosure comprises a data transfer/receiving circuit 310 and first to $m^{th}$ data processing circuits DP1 to DPm.

The data transfer/receiving circuit 310 may be mounted on the control board 400. The data transfer/receiving circuit 310 may receive a digital data signal Idata input from the timing controller 500 mounted on the control board 400 to output digital pixel data corresponding to at least one horizontal line. The data transfer/receiving circuit 310 may receive the digital data signal Idata based on a differential signal transferred from the timing controller 500 according to the high speed serial interface manner, generate digital pixel data corresponding to at least one horizontal line, based on the received digital data signal Idata, and generate a dot clock, a reference clock, and a data start signal from the differential signal. Also, during the touch data reporting period, the data transfer/receiving circuit 310 may collect pixel driving line group-based touch presence data supplied from the first to $m^{th}$ data processing circuits DP1 to DPm to generate touch map data and may transfer the touch map data to the timing controller 500 according to the high speed serial interface manner. In this case, the digital data signal Idata and the touch map data may be transferred or received between the timing controller 500 and the data transfer/receiving circuit 310 according to the high speed serial interface manner (for example, the EPI manner, the LVDS interface manner, or the mini LVDS interface manner).

The data transfer/receiving circuit 310 according to an aspect may include first to $i^{th}$ (where i is a natural number equal to or more than two) data transfer/receiving chips 3101 to 310i. In this case, each of the first to $i^{th}$ data transfer/receiving chips 3101 to 310i may be a minimum-unit microchip or one chipset and may be a semiconductor packaging device which includes an integrated circuit (IC) including transistors and has a fine size.

Each of the first to $i^{th}$ data transfer/receiving chips 3101 to 310i may individually receive digital data signals to be supplied to j pixels (where j is a natural number equal to or more than two) among differential signals transferred from the timing controller 500 through one interface cable 530, individually generate pixel data to be supplied to the j pixels, based on the received digital data signals, and individually generate a dot clock, a reference clock, and a data start signal from the differential signals. For example, when the interface cable 530 has first to $i^{th}$ pairs, the first data transfer/receiving chip 3101 may individually receive digital data signals corresponding to first to $j^{th}$ pixels from the differential signals transferred from the timing controller 500 through the first pair of the interface cable 530, individually generate pixel data corresponding to the first to $j^{th}$ pixels, based on the received digital data signals, and individually generate a dot clock, a reference clock, and a data start signal from the differential signals. Also, the $i^{th}$ data transfer/receiving chip 310i may individually receive digital data signals corresponding to m–j+$1^{th}$ to $m^{th}$ pixels from the differential signals transferred from the timing controller 500 through the $i^{th}$ pair of the interface cable 530, individually generate pixel data corresponding to the m–j+$1^{th}$ to $m^{th}$ pixels, based on the received digital data signals, and individually generate a dot clock, a reference clock, and a data start signal from the differential signals.

The first to $i^{th}$ data transfer/receiving chips 3101 to 310i may individually output digital pixel data through a serial data communication manner using first to $i^{th}$ common serial data buses CSB1 to CSBi each having a data bus corresponding to the number of bits of the digital pixel data, individually output the reference clock to first to $i^{th}$ common reference clock lines RCL1 to RCLi, and individually output the data start signal to first to $i^{th}$ data start signal lines DSL1 to DSLi. For example, the first data transfer/receiving chip 3101 may transfer corresponding digital pixel data, a corresponding reference clock, and a corresponding data start signal through the first common serial data bus CSB1, the first common reference clock line RCL1, and the first data start signal line DSL1. Also, the $i^{th}$ data transfer/receiving chip 310i may transfer corresponding digital pixel data, a corresponding reference clock, and a corresponding data start signal through the $i^{th}$ common serial data bus CSBi, the $i^{th}$ common reference clock line RCLi, and the $i^{th}$ data start signal line DSLi.

During the touch data reporting period, each of the first to $i^{th}$ data transfer/receiving chips 3101 to 310i may collect pixel driving line group-based touch presence data supplied through a corresponding common serial data bus CSB from corresponding data processing circuits of the first to $m^{th}$ data processing circuits DP1 to DPm to generate touch map data and may transfer the generated touch map data to the timing controller 500 according to the high speed serial interface manner.

The data transfer/receiving circuit 310 according to an aspect may be configured with one data transfer/receiving chip. That is, the first to $i^{th}$ data transfer/receiving chips 3101 to 310i may be integrated into one data integration transfer/receiving chip.

Each of the first to $m^{th}$ data processing circuits DP1 to DPm may sample and hold in parallel digital pixel data transferred from the data transfer/receiving circuit 310 according to a data start signal and a reference clock input thereto and may output the input reference clock and the held digital pixel data according to the serial data communication manner. In this case, each of the first to $m^{th}$ data processing circuits DP1 to DPm may be a minimum-unit microchip or one chipset and may be a semiconductor packaging device which includes an IC including transistors and has a fine size.

The first to $m^{th}$ data processing circuits DP1 to DPm may be grouped into first to $i^{th}$ data processing groups 3201 to 320i, and in this case, each of the first to $i^{th}$ data processing groups 3201 to 320i may include j data processing circuits.

On a group basis, the data processing circuits grouped into the first to $i^{th}$ data processing groups 3201 to 320i may be connected to the first to $i^{th}$ common serial data buses CSB1 to CSBi in common. For example, each of the first to $j^{th}$ data processing circuits DP1 to DPj grouped into the first data processing group 3201 may receive corresponding digital pixel data, a corresponding reference clock, and a corresponding start signal through the first common serial data bus CSB1, the first common reference clock line RCL1, and the first data start signal line DSL1. Also, each of m–j+$1^{th}$ to $m^{th}$ data processing circuits DPm–j+1 to DPm grouped into the $i^{th}$ data processing group 320i may receive corresponding digital pixel data, a corresponding reference clock, and a corresponding data start signal through the $i^{th}$ common serial data bus CSBi, the $i^{th}$ common reference clock line RCLi, and the $i^{th}$ data start signal line DSLi.

When digital pixel data having a corresponding number of bits is sampled and held, each of the first to $m^{th}$ data processing circuits DP1 to DPm may output a reference clock input thereto to a first clock transfer line CTL1 of each of first to $m^{th}$ pixel driving line groups LG1 to LGm and may output the held digital pixel data to a first pixel data transfer line DTL1 of each of the first to $m^{th}$ pixel driving line groups LG1 to LGm according to the serial data communication manner.

Moreover, the first to $m^{th}$ data processing circuits DP1 to DPm may respectively and time-serially receive touch presence data sequentially transferred through first sensing data transfer lines STL1 of the first to $m^{th}$ pixel driving line groups LG1 to LGm and may respectively supply the received touch presence data to the first to $i^{th}$ data transfer/receiving chips 3101 to 310i through the first to $i^{th}$ common serial data buses CSB1 to CSBi on a group basis. Therefore, on a corresponding data processing group basis, each of the first to $i^{th}$ data transfer/receiving chips 3101 to 310i may collect touch presence data to generate touch map data and may transfer the generated touch map data to the timing controller 500 according to the high speed serial interface manner.

Each of the first to $m^{th}$ data processing circuits DP1 to DPm according to an aspect may include a latch circuit which samples and latches digital pixel data input through a corresponding common serial data bus CSB according to the reference clock in response to the data start signal, a counter circuit which counts the reference clock to generate a data output signal, a clock bypass circuit which bypasses the reference clock input thereto, and a touch map data generator which collects touch presence data by units of data processing groups to generate touch map data.

Figure 14:
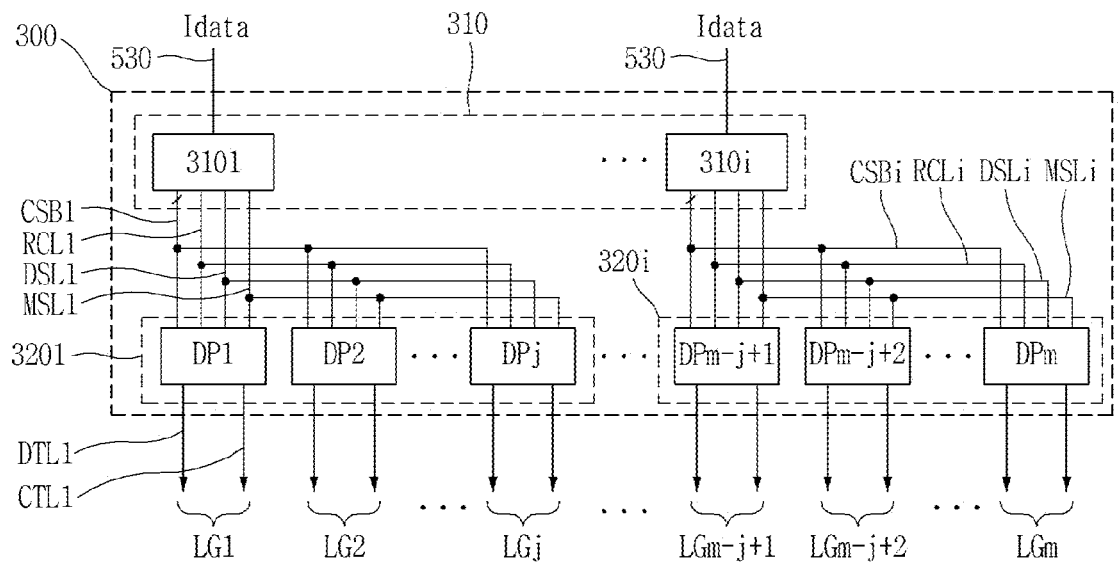
FIG. 14 is a diagram illustrating a data driving circuit unit according to another aspect of the present disclosure illustrated in FIGS. 1 and 2.

FIG. 14 is a diagram illustrating a data driving circuit unit 300 according to another aspect of the present disclosure illustrated in FIGS. 1 and 2.

Referring to FIGS. 1, 2, and 14, the data driving circuit unit 300 according to another aspect of the present disclosure may include a data transfer/receiving circuit 310 and first to $m^{th}$ data processing circuits DP1 to DPm. The data driving circuit unit 300 according to the present aspect may be electrically connected to the first to $m^{th}$ pixel driving line groups LG1 to LGm illustrated in FIG. 10. Therefore, except for that digital pixel data is transferred and touch presence data is received through a pixel data transfer line DTL of each of the first to $m^{th}$ pixel driving line groups LG1 to LGm, the data driving circuit unit 300 according to the present aspect is the same as the data driving circuit unit 300 illustrated in FIG. 13. Hereinafter, therefore, only different elements will be described.

The data transfer/receiving circuit 310 may include first to $i^{th}$ data transfer/receiving chips 3101 to 310$i$. Each of the first to $i^{th}$ data transfer/receiving chips 3101 to 310$i$ may generate digital pixel data, a dot clock, a reference clock, and a data start signal through an interface with the timing controller 500. Also, each of the first to $i^{th}$ data transfer/receiving chips 3101 to 310$i$ may additionally generate a data transfer mode signal, based on the reference clock and may individually output the data transfer mode signal through a corresponding common mode signal line of first to $i^{th}$ common mode signal lines MSL1 to MSLi. In this case, the data transfer/receiving circuit 310 may generate the data transfer mode signal having a first logic state for transferring the digital pixel data, or may generate the data transfer mode signal having a second logic state for transferring sensing data. Except for that the data transfer mode signal is further generated, the data transfer/receiving circuit 310 and the first to $i^{th}$ data transfer/receiving chips 3101 to 310$i$ are the same as the data transfer/receiving circuit 310 illustrated in FIG. 13, and thus, their repeating descriptions will be omitted.

The first to $m^{th}$ data processing circuits DP1 to DPm may respectively output the digital pixel data to first pixel data transfer lines DTL1 of each of the first to $m^{th}$ pixel driving line groups LG1 to LGm in response to the data transfer mode signal having the first logic state and may respectively receive touch presence data sequentially transferred through first pixel data transfer lines DTL1 of each of the first to $m^{th}$ pixel driving line groups LG1 to LGm in response to the data transfer mode signal having the second logic state. Except for that the digital pixel data and the touch presence data are transferred according to the data transfer mode signal, the first to $m^{th}$ data processing circuits DP1 to DPm according to the present aspect are the same as the first to $m^{th}$ data processing circuits DP1 to DPm illustrated in FIG. 13, and thus, their repeating descriptions will be omitted.

Figure 15:
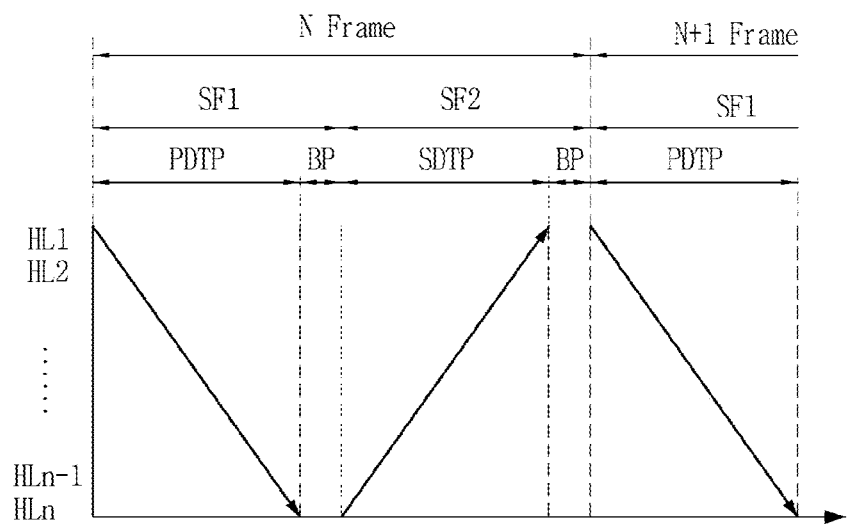
FIG. 15 is a waveform diagram showing a data transfer timing of a display apparatus according to another aspect of the present disclosure.

FIG. 15 is a waveform diagram showing a data transfer timing of a display apparatus according to another aspect of the present disclosure.

A data transfer method of a display apparatus according to another aspect of the present disclosure will be described below with reference to FIGS. 10 to 12 and 15.

First, during a pixel data transfer period PDTP of a first sub-frame SF1 set in an $N^{th}$ frame, digital pixel data corresponding to a corresponding pixel may be sequentially transferred to a first horizontal line HL1 to a last horizontal line HLn through the pixel data transfer lines DTL1 to DTLk of each of the first to $m^{th}$ pixel driving line groups LG1 to LGm, wherein N is a natural number equal to or more than two. At this time, an operation of precharging a plurality of touch electrodes TE with a precharging voltage and an operation of discharging the plurality of touch electrodes TE may be repeated.

Subsequently, a data transfer operation may be reset during a blank period BP of the first sub-frame SF1. At this time, the touch sensing circuit 123 of the first pixel driving chip 120 provided in each of the plurality of sensing driving pixels SDP may sense a capacitance variation value of a corresponding touch electrode TE according to the sensing sampling signal and may generate touch presence data, based on the sensed capacitance variation value.

Subsequently, during a sensing data transfer period SDTP of a second sub-frame SF2 set in the N+1$^{th}$ frame, the touch presence data generated by the touch sensing circuit 123 of the first pixel driving chip 120 provided in each of the plurality of sensing driving pixels SDP may be sequentially transferred in the order from the last horizontal line HLn to the first horizontal line HL1 through the pixel data transfer lines DTL1 to DTLk of each of the first to $m^{th}$ pixel driving line groups LG1 to LGm according to a timing based on the reference clock RCLK. At this time, the plurality of touch electrodes TE may be precharged with the precharging voltage or be discharged. That is, an operation of precharging the plurality of touch electrodes TE with the precharging voltage based on the reference clock RCLK and an operation of discharging the plurality of touch electrodes TE may be repeated during the other period except a sampling period based on the sensing sampling signal.

Subsequently, during the pixel data transfer period PDTP of the first sub-frame SF1 of the $N^{th}$ frame, digital pixel data corresponding to a corresponding pixel may be sequentially transferred to the first horizontal line HL1 to the last horizontal line HLn through the pixel data transfer lines DTL1 to DTLk of each of the first to $m^{th}$ pixel driving line groups LG1 to LGm. At this time, the plurality of touch electrodes TE may be precharged with the precharging voltage or be discharged.

A display apparatus including the sensing driving pixel SDP according to another aspect of the present disclosure may have the same effect as that of the display apparatus according to an aspect of the present disclosure and may be configured in order for the first pixel driving circuit 122 and the touch sensing circuit 123 to share the pixel data transfer lines DTL1 to DTLk, thereby reducing the number of lines disposed on a substrate and the number of terminals (or pins) of the sensing driving pixels SDP.

Figure 16:
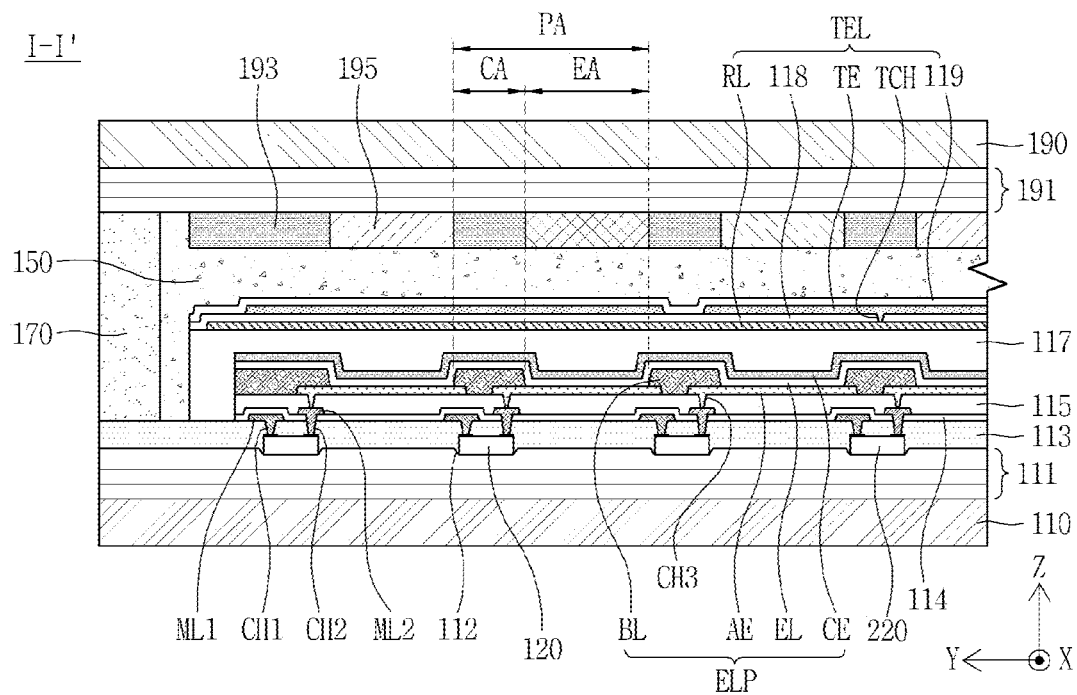
FIG. 16 is a cross-sectional view taken along line I-I' illustrated in FIG. 1.

FIG. 16 is a cross-sectional view taken along line I-I' illustrated in FIG. 1 and is a cross-sectional view illustrating three adjacent pixels provided in the display panel illustrated in FIG. 1.

Referring to FIGS. 2 to 4 and 16, a display apparatus according to an aspect of the present disclosure may include a substrate 110, a buffer layer 111, a plurality of first pixel driving chips 120, a plurality of second pixel driving chips 220, a first planarization layer 113, a line layer, a second planarization layer 115, a light emission part ELP, an encapsulation layer 117, and a touch electrode layer TEL.

The substrate 110, which is a pixel array substrate, may be formed of an insulating material such as glass, quartz, ceramic, or plastic. The substrate 110 may include a plurality of pixel areas PA each including a light emitting area EA and a circuit area CA.

The buffer layer 111 may be provided on the substrate 110. The buffer layer 111 may prevent water from penetrating into the light emission part ELP through the substrate 110. According to an aspect, the buffer layer 111 may include at least one inorganic layer including an inorganic material. For example, the buffer layer 111 may be a multilayer where one or more inorganic layers of silicon oxide ($SiO_x$), silicon nitride ($SiN_x$), silicon oxynitride (SiON), titanium oxide ($TiO_x$), and aluminum oxide ($AlO_x$) are alternately stacked.

The plurality of first pixel driving chips 120 may be mounted on the buffer layer 111 in the circuit area CA of a touch sensing pixel area of the plurality of pixel areas PA through a chip mounting (or transfer) process. The plurality of second pixel driving chips 220 may be mounted on the buffer layer 111 in the circuit area CA of a normal pixel area of the plurality of pixel areas PA through the chip mounting process. The plurality of first and second pixel driving chips 120 and 220 may each have a size of 1 μm to 100 μm, but are not limited thereto. In other aspects, the plurality of first and second pixel driving chips 120 and 220 may each have a size which is smaller than that of the light emitting area EA other than an area occupied by the circuit area CA among the plurality of pixel areas PA. Each of the plurality of first and second pixel driving chips 120 and 220, as described above, has the same configuration as that of the pixel driving chip illustrated in one of FIGS. 4 to 8, 11, and 12, and thus, its repeating description will be omitted. In description below, the plurality of first and second pixel driving chips 120 and 220 may be referred to as a plurality of pixel driving chips 120 and 220.

The plurality of pixel driving chips 120 and 220 may be attached on the buffer layer 111 by means of an adhesive layer. The adhesive layer may be provided on a rear surface (or a back surface) of each of the plurality of pixel driving chips 120 and 220. In this case, in the chip mounting process, a vacuum adsorption nozzle may vacuum-adsorb the plurality of pixel driving chips 120 and 220 each including the rear surface (or the back surface) coated with the adhesive layer, and thus, the plurality of pixel driving chips 120 and 220 may be mounted on (or transferred onto) the buffer layer 111 in a corresponding pixel area PA. Meanwhile, the plurality of pixel driving chips 120 and 220 may be attached to an adhesive layer provided on the entire upper surface of the buffer layer 111.

Optionally, the plurality of pixel driving chips 120 and 220 may be respectively mounted on a plurality of concave portions 112 respectively provided in the circuit areas CA of the plurality of pixel areas PA.

Each of the plurality concave portions 112 may be recessed from a front surface of the buffer layer 111 disposed in a corresponding circuit area CA. For example, each of the plurality of concave portions 112 may have a groove shape or a cup shape which has a certain depth from the front surface of the buffer layer 111. Each of the plurality of concave portions 112 may individually accommodate and fix a corresponding pixel driving chip of the plurality of pixel driving chips 120 and 220, thereby minimizing an increase in thickness of the display apparatus caused by a thickness (or a height) of each of the plurality of pixel driving chips 120 and 220. Each of the plurality of concave portions 112 may be concavely formed to have a shape corresponding to the plurality of pixel driving chips 120 and 220 and to have an inclined surface inclined at a certain angle, and thus, misalignment between the circuit areas CA and the pixel driving chips 120 is minimized in a mount process of mounting the plurality of pixel driving chips 120 and 220 on the buffer layer 111.

The plurality of pixel driving chips 120 and 220 according to an aspect may be respectively attached on floors of the plurality of concave portions 112 by the adhesive layer coated on each of the plurality of concave portions 112. According to another aspect, the plurality of pixel driving chips 120 and 220 may be respectively attached on the floors of the plurality of concave portions 112 by the adhesive layer coated on a whole surface of the buffer layer 111 including the plurality of concave portions 112.

The first planarization layer 113 may be disposed on a front surface of the substrate 110 and may cover the plurality of pixel driving chips 120 and 220. That is, the first planarization layer 113 may cover the buffer layer 111 and the plurality of pixel driving chips 120 and 220 disposed on the substrate 110, and thus, may provide a flat surface on the buffer layer 111 and the plurality of pixel driving chips 120 and 220 and may fix the plurality of pixel driving chips 120 and 220. For example, the first planarization layer 113 may be formed of acryl resin, epoxy resin, phenolic resin, polyamide resin, polyimide resin, and/or the like.

The line layer may include a plurality of first metal lines ML1, an insulation layer 114, and a plurality of second metal lines ML2.

The first metal lines ML1 may be disposed on the first planarization layer 113 to pass through the display area DA in a first direction X or a second direction Y. Each of the first metal lines ML1 may be used as one of a sensing data transfer line, a pixel data transfer line, a clock transfer line, a pixel driving power line, a touch routing line, and a cathode power line, or may be used as a bridge line for diverting one of lines which intersect one another on the same layer. For example, the first metal lines ML1 may be used as the bridge line and the touch routing line. In this case, the touch routing line corresponding to the first metal line ML1 may be electrically connected to an eleventh bump B11 of a corresponding first pixel driving chip 120 through a first chip contact hole CH1 provided in the first planarization layer 113 and may electrically connect a touch electrode TE to the eleventh bump B11 of the corresponding first pixel driving chip 120.

The insulation layer 114 may be disposed on the substrate 110 to cover the first metal lines ML1. For example, the insulation layer 114 may be $SiO_x$, $SiN_x$, SiON, or a multilayer thereof.

The second metal lines ML2 may be disposed on the insulation layer 114 to pass through the display area DA. The second metal lines ML2 may be used as a sensing data transfer line, a pixel data transfer line, a clock transfer line, and a pixel driving power line PL. For example, the pixel data transfer line corresponding to the second metal line ML2 may extend or protrude to the circuit area CA of each pixel area PA and may be electrically connected to a second bump B2 of each of corresponding pixel driving chips 120 and 220 through a second chip contact hole CH2 provided in the insulation layer 114 and the first planarization layer 113 to supply digital pixel data to the second bump B2 of each of the corresponding pixel driving chips 120 and 220. Also, the pixel driving power line PL corresponding to the second metal line ML2 may extend or protrude to the circuit area CA of each pixel area PA and may be electrically connected to a sixth bump B6 of each of corresponding pixel driving chips 120 and 220 through a third chip contact hole provided in in the insulation layer 114 and the first planarization layer 113 to supply a pixel driving voltage Vdd to the sixth bump B6 of each of the corresponding pixel driving chips 120 and 220. In this case, the third chip contact hole may be formed along with the second chip contact hole CH2.

The first metal lines ML1 and the second metal lines ML2 may be formed of molybdenum (Mo), aluminum (Al), silver (Ag), chrome (Cr), gold (Au), titanium (Ti), nickel (Ni), neodymium (Nd), copper (Cu), or an alloy thereof and may be formed of a single layer including at least one of the metals or the alloy or a multilayer which includes two or more layers and includes at least one of the metals or the alloy.

The second planarization layer 115 may be disposed on the substrate 110 to cover the line layer. That is, the second planarization layer 115 may be provided on the substrate 110 to cover the second metal lines ML2 and the insulation layer 114 and may provide a flat surface on the second metal lines ML2 and the insulation layer 114. For example, the second planarization layer 115 may be formed of acryl resin, epoxy resin, phenolic resin, polyamide resin, polyimide resin, and/or the like, but is not limited thereto.

The light emission part ELP may include a plurality of anode electrodes AE, a bank layer BL, a light emitting layer EL, and a cathode electrode CE.

Each of the plurality of anode electrode AE is individually patterned in each of the pixel areas PA. Each of the plurality of anode electrodes AE may be electrically connected to an eighth bump B8 of each of corresponding pixel driving chips 120 and 220 through an anode contact hole CH3 provided in the second planarization layer 115 in a corresponding pixel area PA and may be supplied with a data current through the eighth bump B8 of each of the corresponding pixel driving chips 120 and 220. According to an aspect, the plurality of anode electrodes AE may include a metal material which is high in reflectance. For example, each of the plurality of anode electrodes AE may be formed in a multilayer structure such as a stacked structure (Ti/Al/Ti) including aluminum (Al) and titanium (Ti), a stacked structure (ITO/Al/ITO) including aluminum (Al) and indium tin oxide (ITO), an APC (Al/Pd/Cu) alloy of Al, palladium (Pd), and Cu, or a stacked structure (ITO/APC/ITO) including an APC alloy and ITO, or may include a single-layer structure including one material or an alloy of two or more materials selected from among silver (Ag), aluminum (Al), molybdenum (Mo), gold (Au), magnesium (Mg), calcium (Ca), and barium (Ba).

The bank layer BL may define the light emitting area EA in each of the plurality of pixel areas PA and may be referred to as a pixel defining layer (or an isolation layer). The bank layer BL may be provided on the second planarization layer 115 and in an edge of each of the plurality of anode electrodes AE and may overlap the circuit area CA of the pixel area PA to define the light emitting area EA in each pixel area PA. For example, the bank layer BL may be formed of one organic material of acryl resin, epoxy resin, phenolic resin, polyamide resin, polyimide resin, benzocyclobutene resin, and fluorine resin. As another example, the bank layer BL may be formed of a photosensitive material including a black pigment. In this case, the bank layer BL may act as a light blocking pattern.

The light emitting layer EL may be disposed in the light emitting area EA on the plurality of anode electrodes AE.

The light emitting layer EL according to an aspect may include two or more sub-light emitting layers for emitting white light. For example, the light emitting layer EL may include a first sub-light emitting layer and a second sub-light emitting layer for emitting white light based on a combination of first light and second light. In this case, the first sub-light emitting layer may emit the first light and may include one of a blue light emitting layer, a green light emitting layer, a red light emitting layer, a yellow light emitting layer, and a yellow-green light emitting layer. The second sub-light emitting layer may include a light emitting layer, which emits light having a complementary color relationship with the first light, of a blue light emitting layer, a green light emitting layer, a red light emitting layer, a yellow light emitting layer, and a yellow-green light emitting layer. Since the light emitting layer EL emits white light, the light emitting layer EL may be provided on the substrate 110 to cover the plurality of anode electrodes AE and the bank layer BL without being individually patterned in each pixel area PA.

Additionally, the light emitting layer EL may additionally include one or more function layers for enhancing the emission efficiency and/or lifetime of the light emitting layer EL.

The cathode electrode CE may be disposed to cover the light emitting layer EL. In order for light emitted from the light emitting layer EL to be irradiated onto the opposite substrate 190, the cathode electrode CE according to an aspect may be formed of indium tin oxide (ITO) or indium zinc oxide (IZO), which is a transparent conductive material such as transparent conductive oxide (TCO). In this case, the display apparatus is a top-emission type display apparatus.

The encapsulation layer 117 may be disposed on the substrate 110 to cover the light emission part ELP. The encapsulation layer 117 according to an aspect may prevent oxygen or water from penetrating into the light emitting layer EL of the light emission part ELP. According to an aspect, the encapsulation layer 117 may include one inorganic material of silicon oxide ($SiO_x$), silicon nitride ($SiN_x$), silicon oxynitride (SiON), titanium oxide ($TiO_x$), and aluminum oxide ($AlO_x$).

Optionally, the encapsulation layer 117 may further include at least one organic layer. The organic layer may be formed to have a sufficient thickness, for preventing particles from penetrating into a light emitting device layer via the encapsulation layer 117. According to an aspect, the organic layer may be formed of one organic material of acryl resin, epoxy resin, phenolic resin, polyamide resin, polyimide resin, benzocyclobutene resin, and fluorine resin.

According to an aspect of the present disclosure, the substrate 110 may further include a plurality of cathode power lines which are disposed in parallel on the insulation layer 114 with at least pixel driving line groups LG1 to LGm therebetween to pass through the display area DA.

Figure 17:
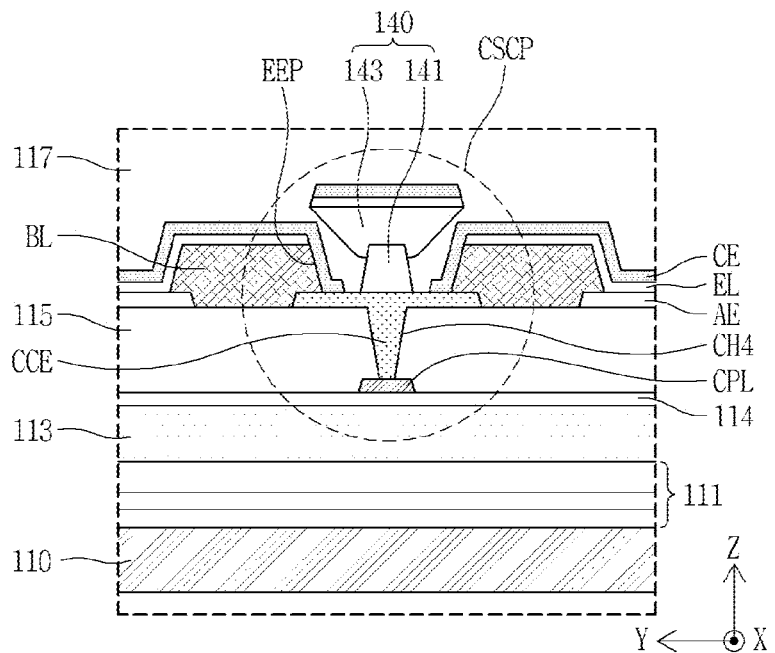
FIG. 17 is a cross-sectional view illustrating a connection structure between a cathode electrode and a cathode power line according to an aspect of the present disclosure.

The plurality of cathode power lines may receive a cathode voltage (for example, a ground voltage) from the power management circuit 600 through the pad part PP. The plurality of cathode power lines may be selected from among the second metal lines ML2 or the first metal lines ML1. That is, some of the second metal lines ML2 may be used as a plurality of cathode power lines. The plurality of cathode power lines may be electrically connected to the cathode electrode CE in the display area DA. To this end, as shown in FIG. 17, the bank layer BL may include a plurality of cathode sub-contact parts CSCP which are electrically connected to a plurality of cathode power lines CPL and a cathode electrode CE.

The plurality of cathode sub-contact part CSCP may include a plurality of cathode connection electrodes CCE and a plurality of electrode exposure parts EEP.

The plurality of cathode connection electrodes CCE may be provided in an island shape on the second planarization layer 115 overlapping the bank layer BL and may be formed of the same material along with the anode electrode AE. An edge, other than a center, of each of the cathode connection electrodes CCE may be surrounded by the bank layer BL and may be spaced apart from and electrically disconnected from an adjacent anode electrode AE. Each of the cathode connection electrodes may be electrically connected to a corresponding cathode power line CPL through a cathode contact hole CH4 provided in the second planarization layer 115. In this case, one cathode power line CPL may be electrically connected to at least one cathode connection electrode CCE through at least one cathode contact hole CH4.

The plurality of electrode exposure parts EEP may be disposed on the bank layer BL overlapping the plurality of cathode connection electrodes CCE and may respectively expose the plurality of cathode connection electrodes CCE. Thus, the cathode electrode CE may be electrically connected to each of the plurality of cathode connection electrodes CCE respectively exposed through the plurality of electrode exposure parts EEP and may be electrically connected to each of the plurality of cathode power lines CPL through the plurality of cathode connection electrodes CCE, and thus, may have a relatively low resistance. In particular, the cathode electrode CE may receive the cathode voltage from each of the plurality of cathode power lines CPL through the plurality of cathode connection electrodes CCE, thereby preventing non-uniform luminance caused by the voltage drop (IR drop) of the cathode voltage supplied to the cathode electrode CE.

In addition, according to an aspect of the present disclosure, the substrate 110 may further include a partition wall part 140.

The partition wall part 140 may include a partition wall supporting part 141 disposed in each of the plurality of cathode connection electrodes CCE and a partition wall 143 disposed on the partition wall supporting part 141.

The partition wall supporting part 141 may be formed in the center of each of the plurality of cathode connection electrodes CCE to have a tapered structure having a trapezoidal cross-section.

The partition wall 143 may be provided on the partition wall supporting part 141 to have a reverse-tapered structure where a width of a lower surface is narrower than that of an upper surface, and may hide a corresponding electrode exposure part EEP. For example, the partition wall 143 may include a lower surface having a first width supported by the partition wall supporting part 141, an upper surface having a second width which is greater than the first width and is greater than or equal to a width of the electrode exposure part EEP, and an inclined surface which is disposed between the lower surface and the upper surface to hide the electrode exposure part EEP. The upper surface of the partition wall 143 may be provided to cover the electrode exposure part EEP and to one-dimensionally have a size which is greater than or equal to that of the electrode exposure part EEP, and thus, a light emitting material may be prevented from penetrating into the cathode connection electrode CCE exposed at the electrode exposure part EEP in a process of depositing the light emitting layer EL, whereby a cathode electrode material may be electrically connected to the cathode connection electrode CCE exposed at the electrode exposure part EEP in the process of depositing the light emitting layer EL. A penetration space (or a void) may be provided between the inclined surface of the partition wall 143 and the cathode connection electrode CCE exposed at the electrode exposure part EEP, and the edge of the cathode electrode CE may be electrically connected to the cathode connection electrode CCE exposed at the electrode exposure part EEP through the penetration space.

Referring again to FIG. 16 in conjunction with FIGS. 1 to 4, the touch electrode layer TEL may further include a plurality of touch electrodes TE and a plurality of touch routing lines RL, which are disposed on the encapsulation layer 117.

Each of the plurality of touch electrodes TE may be disposed on the encapsulation layer 117 disposed on the substrate 110 and may act as a touch sensor for sensing a touch performed by a touch object, and thus, may be formed of a transparent conductive material. In this case, the touch object may be defined as a user's finger or a touch pen such as an active stylus pen.

According to an aspect, each of the plurality of touch electrodes TE may have a rectangular shape, an octagonal shape, a circular shape, or a lozenge shape.

The plurality of touch routing lines RL may be respectively connected to the plurality of touch electrodes TE. According to an aspect, each of the plurality of touch routing lines RL may be disposed on a front surface of the encapsulation layer 117 to overlap the bank layer BL. For example, the plurality of touch routing lines RL may be disposed to pass through the display area DA in the second direction Y. Each of the plurality of touch routing lines RL may be connected to a corresponding first metal line ML1 of the first metal lines ML1 at one edge and/or the other edge of the substrate 110 and may be electrically connected to the eleventh bump B11 of the first pixel driving chip 120 provided in a corresponding sensing driving pixel. The plurality of touch routing lines RL may have the same length, based on a line resistance and/or the like.

The plurality of touch routing lines RL may be covered by the touch insulation layer 118. Thus, the plurality of touch routing lines RL may be disposed under the plurality of touch electrodes and may be covered by the touch insulation layer 118.

The touch insulation layer 118 may be directly provided on the front surface of the encapsulation layer 117 to cover the plurality of touch routing lines RL. The touch insulation layer 118 may be formed of an organic material or an inorganic material. When the touch insulation layer 118 includes an organic material, the touch insulation layer 118 may be formed through a coating process of coating the organic material on the encapsulation layer 117 and a curing process of curing the organic material at a temperature of 100° C. or less. When the touch insulation layer 118 includes an inorganic material, the touch insulation layer 118 may be formed of the inorganic material deposited on the encapsulation layer 117 through a low temperature chemical vapor deposition and a cleaning process which are alternately performed twice or more.

Each of the plurality of touch electrodes TE may be used as a self-capacitive touch sensor, and thus, each of the touch electrodes TE may have a size greater than a minimum contact area between the touch object and the display panel 100. Thus, each of the plurality of touch electrodes TE may be provided on the touch insulation layer 118 to have a size corresponding to one or more pixels P and may be electrically connected to a corresponding touch routing line RL through a touch contact hole TCH provided in the touch insulation layer 118 overlapping the corresponding touch routing line RL.

Moreover, the plurality of touch electrodes TE according to an aspect may be arranged at certain intervals in the first direction X and the second direction Y.

The plurality of touch electrodes TE may be covered by a passivation layer 119. The passivation layer 119 may be provided on the plurality of touch electrodes TE and the touch insulation layer 118 to cover the plurality of touch electrode TE. Optionally, the passivation layer 119 may be mitted, and in this case, the plurality of touch electrodes TE may covered by a transparent adhesive layer 150.

The opposite substrate 190 may be defined as a color filter array substrate. The opposite substrate 190 according to an aspect may include a barrier layer 191, a black matrix 193, and a color filter layer 195.

The barrier layer 191 may be provided one whole surface of the opposite substrate 190 facing the substrate 110 and may prevent penetration of external water or moisture. The barrier layer 191 according to an aspect may include at least one inorganic layer including an inorganic material. For example, the barrier layer 191 may be formed of a multilayer where one or more inorganic layers of silicon oxide ($SiO_x$), silicon nitride ($SiN_x$), silicon oxynitride (SiON), titanium oxide ($TiO_x$), and aluminum oxide ($AlO_x$) are alternately stacked.

The black matrix 193 may be disposed on the barrier layer 191 to overlap the bank layer BL provided on the substrate 110 and may define a plurality of transmissive parts respectively overlapping the light emitting areas EA of the plurality of pixel areas PA. The black matrix 193 may be formed of a resin material or an opaque metal material such as chrome Cr or CrOx, or may be formed of a light absorbing material.

The color filter layer 195 may be disposed in each of the plurality of transmissive parts provided by the black matrix 193. The color filter layer 195 may include one of a red color filter, a green color filter, and a blue color filter. The red color filter, the green color filter, and the blue color filter may be repeatedly disposed in the first direction X.

Optionally, the color filter layer 195 may include a quantum dot which has a size enabling light of a predetermined color to be emitted and re-emits light according to light incident from the light emitting layer EL. In this case, the quantum dot may be selected from among CdS, CdSe, CdTe, CdZnSeS, ZnS, ZnSe, GaAs, GaP, GaAs—P, Ga—Sb, InAs, InP, InSb, AlAs, AlP, AlSb, and the like. For example, the red color filter may include a quantum dot of CdSe or InP emitting red light, the green color filter may include a quantum dot of CdZnSeS emitting green light, and the blue color filter may include a quantum dot of ZnSe emitting blue light. As described above, when the color filter layer 195 includes a quantum point, a color reproduction rate increases.

The opposite substrate 190 may be opposite-bonded to the substrate 110 by the transparent adhesive layer 150.

The transparent adhesive layer 150 may be referred to as a filler. The transparent adhesive layer 150 according to an aspect may be formed of a material capable of being filling between the substrate 110 and the opposite substrate 190, and for example, may be formed of a transparent epoxy material capable of transmitting light, but the present disclosure is not limited thereto. The transparent adhesive layer 150 may be formed on the substrate 110 by a process such as an inkjet process, a slit coating process, or a screen printing process, but is not limited thereto. In other aspects, the transparent adhesive layer 150 may be provided on the opposite substrate 190.

Additionally, the display apparatus according to an aspect of the present disclosure may further include a dam pattern 170 which surrounds an outer portion of the transparent adhesive layer 150.

The dam pattern 170 may be provided in an edge of the opposite substrate 190 in a closed loop form. The dam pattern 170 according to an aspect may be provided in an edge of the barrier layer 191 provided on the opposite substrate 190 to have a certain height. The dam pattern 170 may block the spread or overflow of the transparent adhesive layer 150 and may bond the substrate 110 to the opposite substrate 190. The dam pattern 170 according to an aspect may be formed of a high-viscosity resin (for example, an epoxy material) capable of being cured by light such as ultraviolet (UV). Furthermore, the dam pattern 170 may be formed of an epoxy material including a getter material capable of adsorbing water and/or oxygen, but is not limited thereto. The dam pattern 170 may block penetration of external water and/or oxygen into a gap between the substrate 110 and the opposite substrate 190 bonded to each other to protect the light emitting layer EL from the external water and/or oxygen, thereby increasing the reliability of the light emitting layer EL and preventing the lifetime of the light emitting layer EL from being reduced by the water and/or oxygen.

Figure 18:
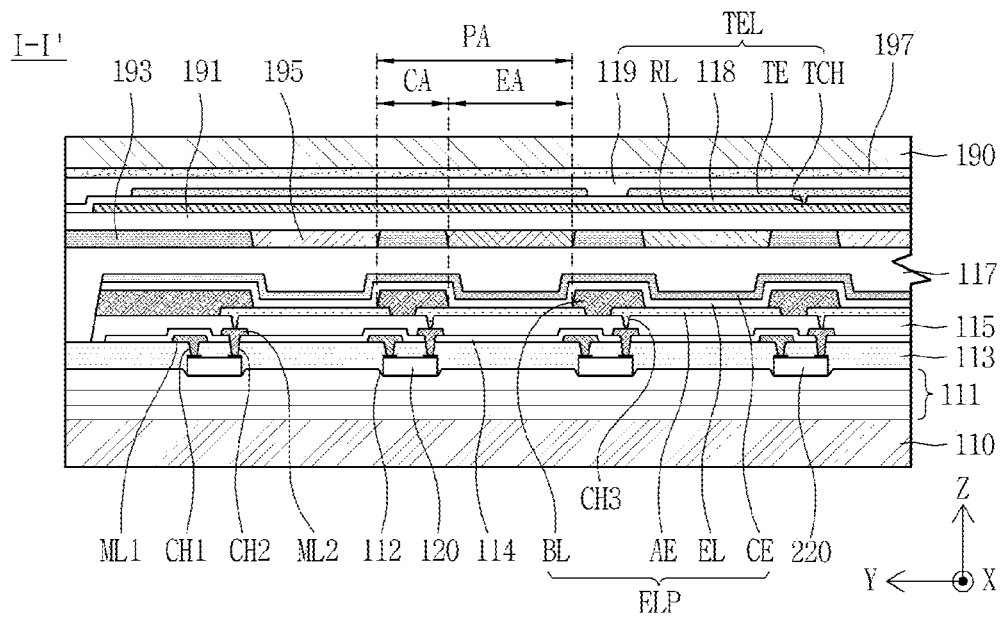
FIG. 18 is another cross-sectional view taken along line I-I' illustrated in FIG. 1.

The barrier layer 191, the black matrix 193, and the color filter layer 195 shown in FIG. 16 may be disposed on the encapsulation layer 117 of the substrate 110 as shown in FIG. 18, instead of the opposite substrate 190.

Referring to FIG. 18, the barrier layer 191, the black matrix 193, and the color filter layer 195 may be disposed between the encapsulation layer 117 and the touch electrode layer TEL.

The black matrix 193 may be directly provided on the front surface of the encapsulation layer 117 to overlap the bank layer BL provided on the substrate 110 and may define the plurality of transmissive parts respectively overlapping the light emitting areas EA of the plurality of pixel areas PA.

The color filter layer 195 may be disposed on the front surface of the encapsulation layer 117 exposed by each of the plurality of transmissive parts defined by the black matrix 193. Except for that the color filter layer 195 is provided on the encapsulation layer 117, the color filter layer 195 is the same as described above, and thus, a repetitive description thereof will be omitted.

The barrier layer 191 according to an aspect may be provided on the front surface of the encapsulation layer 117 to cover the color filter layer 195 and the black matrix 193 and may provide a flat surface on the black matrix 193 and the color filter layer 195. In this case, in a case where the barrier layer 191 is formed through a high-temperature process, the light emitting layer EL and/or the like disposed on the substrate 110 may be damaged by a high temperature. Thus, the barrier layer 191 may be formed of an organic material such as an acryl-based, epoxy-based, or siloxane-based organic insulating material capable of being processed at a low temperature of 100° C. or less, in order to prevent the damage of the light emitting layer EL vulnerable to a high temperature.

The touch electrode layer TEL according to an aspect may be disposed on the barrier layer 191.

According to another aspect, the touch electrode layer TEL may be disposed on the front surface of the encapsulation layer 117 and under the color filter layer 195 and the black matrix 193. In this case, the touch routing line RL may be covered by the black matrix 193, thereby preventing external light from being reflected by the touch routing line RL.

The opposite substrate 190 may be attached on a front surface of the barrier layer 191 by an optical adhesive member 197 instead of the transparent adhesive layer 150. In this case, the optical adhesive member 197 may be an optically clear adhesive (OCA), an optically clear resin (OCR), or a pressure sensitive adhesive (PSA).

Since the opposite substrate 190 is attached to the front surface of the barrier layer 191 by the optical adhesive member 197, the above-described dam pattern 170 may be omitted.

Moreover, the color filter layer 195 shown in FIG. 18 may be disposed between the anode electrode AE and the substrate 110 to overlap the light emitting area EA of each pixel area PA. For example, the color filter layer 195 may be disposed on the buffer layer 111 or the second planarization layer 115 overlapping the light emitting area EA of each pixel area PA. In this case, the anode electrode AE may be formed of a transparent conductive material, and the cathode electrode CE may be formed of a metal material which is high in reflectance, whereby light emitted from the light emitting layer EL may sequentially pass through the color filter layer 195 and the substrate 110 and may be output to the outside. In this case, the display apparatus is a bottom-emission type display apparatus.

Figure 19:
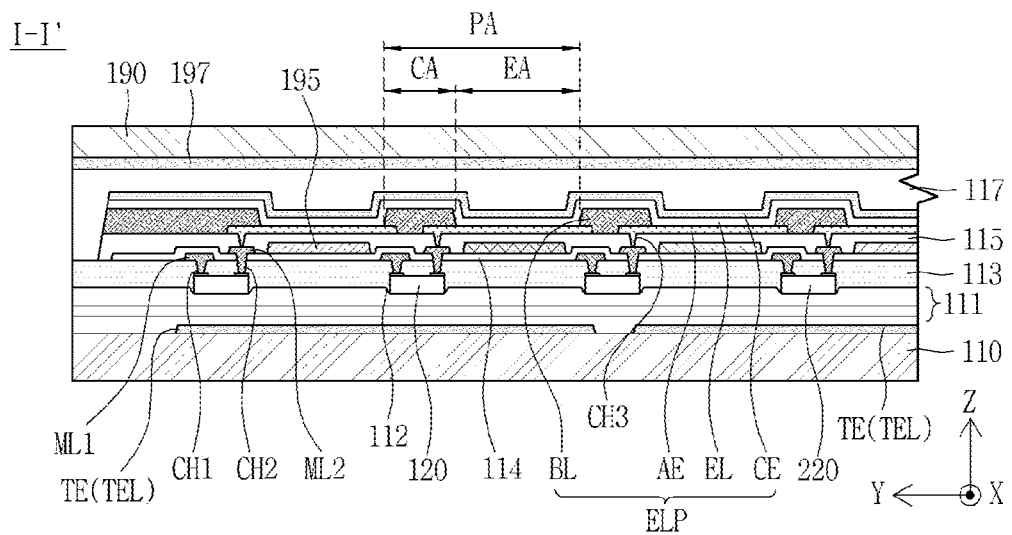
FIG. 19 is another cross-sectional view taken along line I-I' illustrated in FIG. 1.
Figure 20:
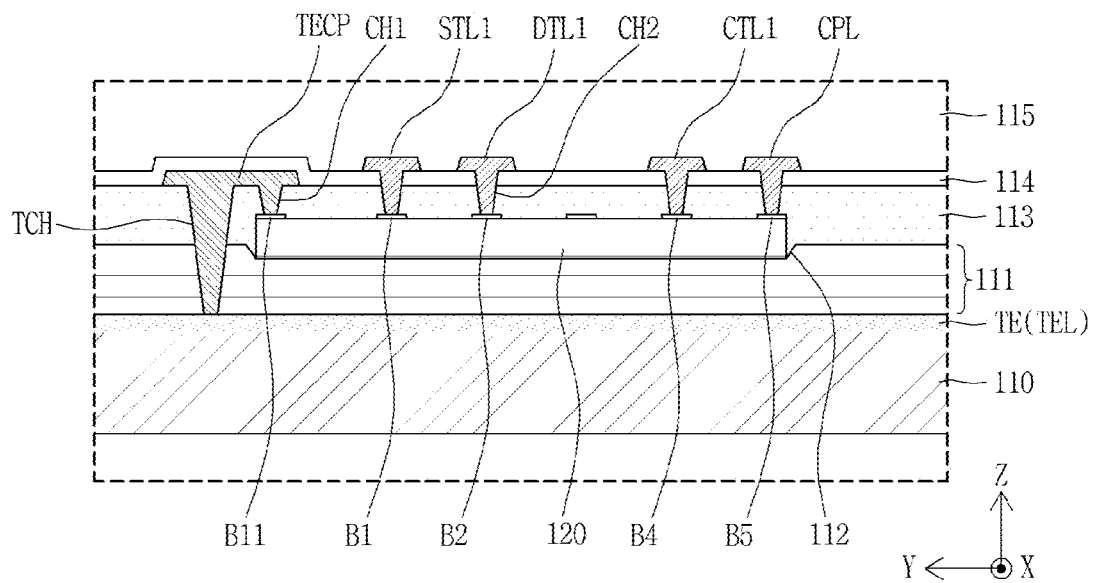
FIG. 20 is a diagram illustrating a connection structure between one touch electrode and a first pixel driving chip illustrated in FIG. 19.

FIG. 19 is another cross-sectional view taken along line I-I' illustrated in FIG. 1. FIG. 20 is a diagram illustrating a connection structure between one touch electrode and a first pixel driving chip illustrated in FIG. 19 and illustrates the connection structure which is implemented by modifying a disposition structure of the color filter layer and the touch electrode layer illustrated in FIG. 18. Hereinafter, therefore, a disposition structure of a color filter layer and a touch electrode layer will be mainly described, and the other elements are not described or will be briefly described.

Referring to FIGS. 19 and 20 in conjunction with FIG. 4, a touch electrode layer TEL according to the present aspect may be disposed on a front surface of a substrate 110. That is, the touch electrode layer TEL may be disposed between the substrate 110 and a buffer layer 111. The touch electrode layer TEL according to an aspect may include a plurality of touch electrodes TE which are disposed in a display area DA of the substrate 110 and overlaps two or more pixel areas.

The plurality of touch electrodes TE may be disposed in the display area DA and may be arranged at certain intervals in a first direction X and a second direction Y intersecting the first direction X. For example, the substrate 110 may include 72 touch electrodes arranged in a lengthwise direction X and 128 touch electrodes arranged in a widthwise direction Y, but is not limited thereto. For example, the number of touch electrodes included in the substrate 110 may be changed based on a resolution and/or a touch resolution of the display apparatus.

Each of the plurality of touch electrodes TE according to an aspect may have a square shape, a rectangular shape, an octagonal shape, a circular shape, or a lozenge shape.

The buffer layer 111 may be disposed on the substrate 110 to cover the plurality of touch electrodes TE.

Each of a plurality of first pixel driving chips 120 and a plurality of second pixel driving chips 220 may be mounted on the buffer layer 111 in a corresponding pixel area. The plurality of first pixel driving chips 120 and the plurality of second pixel driving chips 220 may be covered by a first planarization layer 113.

One first pixel driving chip 120 of two or more pixel driving chips 120 and 220 respectively overlapping the plurality of touch electrodes TE may be electrically connected to a corresponding touch electrode TE. That is, each of the plurality of first pixel driving chips 120 may be electrically connected to a corresponding touch electrode TE through a touch contact hole TCH provided in the first planarization layer 113 and the buffer layer 111. For example, an eleventh bump B11 of each of the plurality of first pixel driving chips 120 may be electrically connected to a touch electrode connection pattern TECP disposed on the first planarization layer 113 through a first chip contact hole CH1 provided in the first planarization layer 113. Also, the touch electrode connection pattern TECP may be electrically connected to a corresponding touch electrode TE through a touch contact hole TCH. In this case, the touch electrode connection pattern TECP may be provided in an island shape along with a first metal line ML1 provided on the first planarization layer 113. Therefore, each of the plurality of first pixel driving chips 120 according to the present aspect may be directly connected to a corresponding touch electrode TE disposed just thereunder through the touch electrode connection pattern TECP having an island shape, and thus, a plurality of touch routing lines may be removed, thereby simplifying a line structure on the substrate 110.

A color filter layer 195 according to the present aspect may be disposed between an insulation layer 114 and a second planarization layer 115 overlapping the light emitting area EA of each of a plurality of pixel area PA. Therefore, the anode electrode AE may be formed of a transparent conductive material, and the cathode electrode CE may be formed of a metal material which is high in reflectance, whereby light emitted from a light emitting layer EL may sequentially pass through the color filter layer 195 and the substrate 110 and may be output to the outside.

In a display apparatus including the touch electrode layer TEL according to the present aspect, each of the first pixel driving chips 120 including a touch sensing circuit may be connected to the touch electrode connection pattern TECP having an island shape without a touch routing line having a length relatively longer than that of each of the touch electrodes TE, and thus, a connection structure between the touch electrodes TE and the first pixel driving chips 120 may be simplified, thereby enhancing touch sensing sensitivity.

Figure 21:
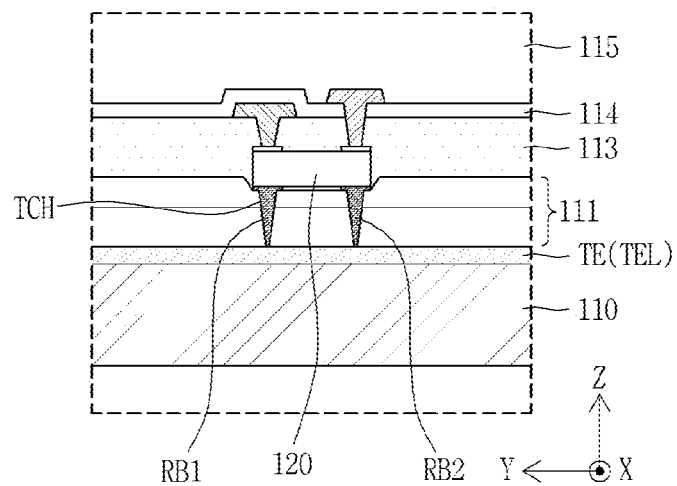
FIG. 21 is a diagram illustrating a connection structure between a touch electrode and a first pixel driving chip according to another aspect illustrated in FIG. 19.

FIG. 21 is a diagram illustrating a connection structure between a touch electrode and a first pixel driving chip according to another aspect illustrated in FIG. 19 and illustrates the connection structure implemented by modifying a bump structure of a first pixel driving chip. Hereinafter, therefore, a connection structure between a touch electrode and a first pixel driving chip will be mainly described, and the other elements are not described or will be briefly described.

Referring to FIG. 21 in conjunction with FIGS. 4 and 19, in a display apparatus according to the present aspect, a first pixel driving chip 120 provided in each of a plurality of sensing driving pixels may include one or more rear bumps RB1 and RB2.

The one or more rear bumps RB1 and RB2 may protrude from a rear surface of the first pixel driving chip 120 to a substrate 110 and may be directly connected to a touch electrode TE through a buffer layer 111. The one or more rear bumps RB1 and RB2 according to an aspect may be directly connected to the touch electrode TE through a touch contact hole TCH provided in the buffer layer 111. Therefore, the touch electrode TE may be connected to a touch sensing circuit 123 of the first pixel driving chip 120 through the rear bumps RB1 and RB2.

Optionally, the first pixel driving chip 120 may include a plurality of rear bumps RB1 and RB2 directly connected to the touch electrode TE through a touch contact hole TCH provided in the buffer layer 111. In this case, the touch sensing circuit 123 of the first pixel driving chip 120 may be connected to the touch electrode TE through at least one of the plurality of rear bumps RB1 and RB2. That is, all of the plurality of rear bumps RB1 and RB2 may be connected to the touch electrode TE through a touch contact hole TCH, for stably fixing the first pixel driving chip 120. A rear bump, which is not connected to the touch sensing circuit 123 of the first pixel driving chip 120, of the plurality of rear bumps RB1 and RB2 may be set as an NC bump or a dummy bump.

In the display apparatus according to the present aspect, since the first pixel driving chip 120 including the touch sensing circuit is directly connected to the touch electrode TE through the rear bumps RB1 and RB2 without a touch routing line or a connection pattern, a connection structure between the touch electrode TE and the first pixel driving chip 120 may be more simplified, thereby more enhancing touch sensing sensitivity.

Since the display apparatus according to the present aspect may include a sensing driving pixel including a pixel driving chip connected to a touch electrode, the sensing driving pixel may display an image, and the touch electrode may sense a touch, thereby sensing a user touch without a separate touch driving circuit. Particularly, in an aspect of the present disclosure, a light emission part may emit light, based on a reference clock and digital pixel data, and thus, a plurality of gate lines for sequentially selecting a plurality of pixels and a gate driving circuit for driving the plurality of pixels may be removed (or omitted) from a substrate, thereby simplifying a configuration of the display apparatus. Accordingly, since the gate driving circuit is removed from the substrate, a bezel width of the display apparatus is maximally reduced.

Moreover, in an aspect of the present disclosure, each of the gate driving circuit and the data driving circuit for driving each pixel of the display panel may be implemented as a microchip mounted on a substrate, and thus, a process of forming at least one TFT for each pixel of a general display panel is not needed. Also, since a transistor is not disposed on the substrate of the display panel, image quality is prevented from being degraded due to non-uniform luminance caused by a threshold voltage deviation of driving transistors occurring between pixels.

Figure 22:
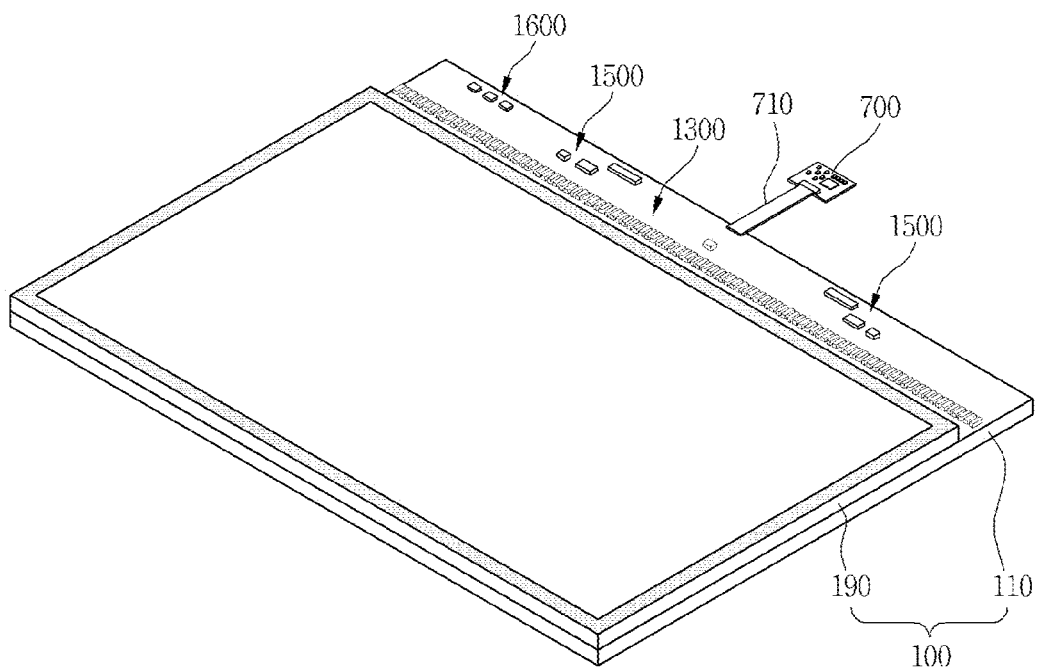
FIG. 22 is a diagram illustrating a display apparatus according to another aspect of the present disclosure.
Figure 23:
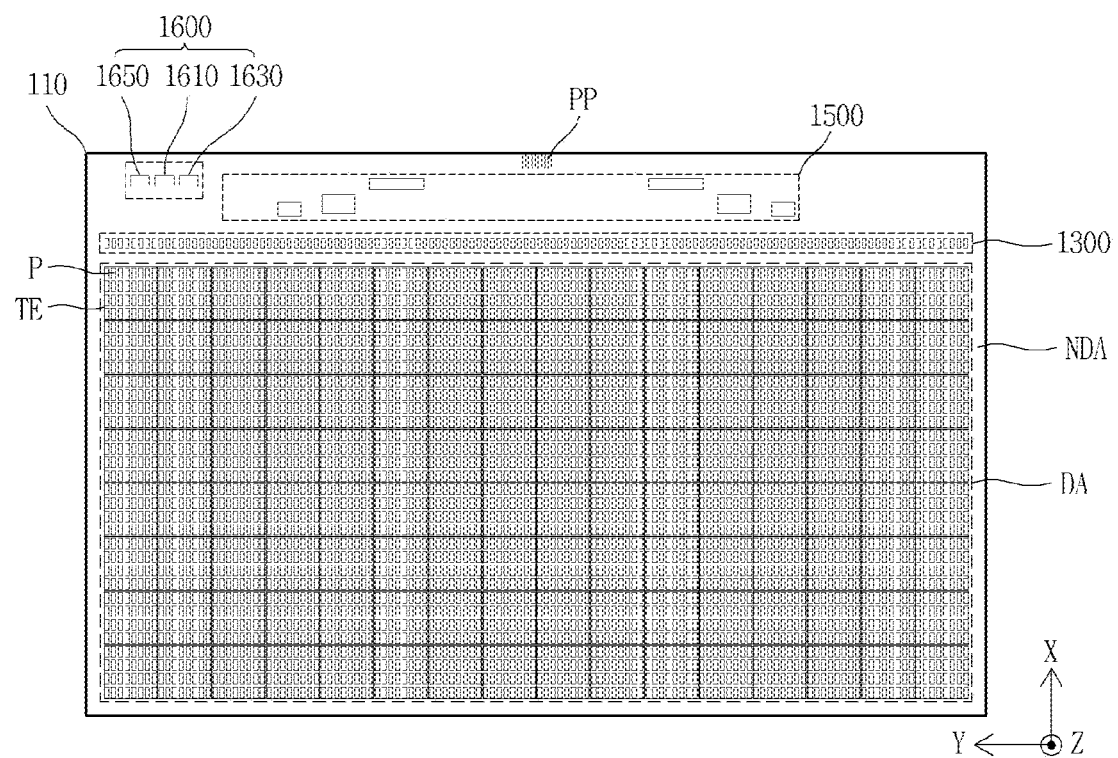
FIG. 23 is a diagram illustrating a substrate illustrated in FIG. 22.

FIG. 22 is a diagram illustrating a display apparatus according to another aspect of the present disclosure. FIG. 23 is a diagram illustrating a substrate illustrated in FIG. 22 and illustrates an example where each of the timing controller and the power management circuit of the display apparatus illustrated in FIGS. 1 to 21 is implemented as a microchip, and the microchip is mounted on a substrate of a display panel.

Referring to FIGS. 22 and 23, the display apparatus according to another aspect of the present disclosure may include a display panel 100, a data driving chip array part 1300, a timing controller chip array part 1500, and a power management chip array part 1600.

The display panel 100 may include a substrate 110 and an opposite substrate 190 and is the same as the display panel of the display apparatus according to an aspect of the present disclosure illustrated in FIGS. 1 to 21. Thus, like reference numerals refer to like elements, and a repetitive description thereof will be omitted.

The timing controller chip array part 1500 may be provided in a first non-display area to generate a digital data signal, based on an image signal (or a differential signal) supplied from a display driving system 700 through a pad part PP and may provide the digital data signal to the data driving chip array part 1300. That is, the timing controller chip array part 1500 may receive the differential signal input through the pad part PP to generate frame-based digital pixel data, a dot clock, a reference clock, and a data start signal from the differential signal. Also, the timing controller chip array part 1500 may perform image processing for image quality improvement on the digital data signal in units of frames, segment the frame-based digital data signal in units of at least one horizontal line, and provide a plurality of segmented digital data signals to the data driving chip array part 1300. Also, during a touch data reporting period, the timing controller chip array part 1500 may collect pixel driving line group-based touch presence data supplied from the data driving chip array part 1300 to generate touch map data and may transfer the touch map data to the display driving system 700 according to the high speed serial interface manner.

The data driving chip array part 1300 may be provided in the first non-display area (or an upper non-display area) of the substrate 110. Also the data driving chip array part 1300 may receive the digital pixel data, the reference clock, and the data start signal supplied from the timing controller chip array part 1500 and align the digital pixel data, based on the reference clock and the data start signal. Also the data driving chip array part 1300 may output the aligned digital pixel data to a first pixel data transfer line of each of first to $m^{th}$ pixel driving line groups according to the high speed serial interface manner and may output the reference clock to a first clock transfer line of each of the first to $m^{th}$ pixel driving line groups.

Moreover, the data driving chip array part 1300 may receive the touch presence data transferred through a sensing data transfer line of each of the first to $m^{th}$ pixel driving line groups and may transfer the received touch presence data to the timing controller chip array part 1500.

The power management chip array part 1600 may be provided in the non-display area of the substrate 110 and may output various kinds of voltages for displaying an image in each pixel P of the display panel 100, based on an input power supplied from the display driving system 700 through the pad part PP disposed in the substrate 110. According to an aspect, the power management chip array part 1600 may generate a transistor logic voltage, a pixel driving voltage, a cathode voltage, and a precharging voltage, based on the input power.

The power management chip array part 1600 according to an aspect may include a DC-DC converter chip array part which is provided in the non-display area NDA of the substrate 110 and performs DC-DC conversion on the input power received from the outside to output the converted input power.

The DC-DC converter chip array part may include a logic power chip 1610 and a driving power chip 1630. In this case, the logic power chip 1610 and the driving power chip 1630 may be a minimum-unit microchip or one chipset and may be a semiconductor packaging device which includes an IC including transistors and has a fine size.

The logic power chip 1610 may generate a transistor logic voltage, based on the input power and may provide the transistor logic voltage to a microchip that requires the transistor logic voltage. For example, the logic power chip 1610 may decrease (step down) the input power to generate the transistor logic voltage of 3.3V. Also, the logic power chip 1610 may generate a ground voltage, based on the input power and may provide the ground voltage to a microchip that requires the ground voltage. In this case, the ground voltage may be used as the cathode voltage supplied to a cathode electrode disposed in the display panel 100. According to an aspect, the logic power chip 1610 may be a DC-DC converter (for example, a step-down converter chip or a buck converter chip), but is not limited thereto.

The driving power chip 1630 may generate the pixel driving voltage, based on the input power and may provide the pixel driving voltage to each pixel P and a microchip that require the pixel driving voltage. For example, the driving power chip 1630 may generate the pixel driving voltage of 12V. According to an aspect, the driving power chip 1630 may be a DC-DC converter (for example, a step-up converter chip or a boost converter chip), but is not limited thereto.

The power management chip array part 1600 according to this example may further include a serial communication chip 1650. In this case, the serial communication chip 1650 may be a minimum-unit microchip or one chipset and may be a semiconductor packaging device which includes an IC including transistors and has a fine size.

The serial communication chip 1650 may be connected to the display driving system 700 through a connector attached on a serial communication pad disposed at one non-display area of the substrate 110, separately from the pad part PP disposed on the substrate 110. The serial communication chip 1650 may receive a voltage tuning signal supplied from the display driving system 700, may restore the received voltage tuning signal to voltage tuning data, and may transfer the voltage tuning data to the logic power chip 1610 and the driving power chip 1630, thereby allowing a voltage level of at least one of the logic voltage, the pixel driving voltage, and the cathode voltage to be tuned based on the voltage tuning data.

Figure 24:
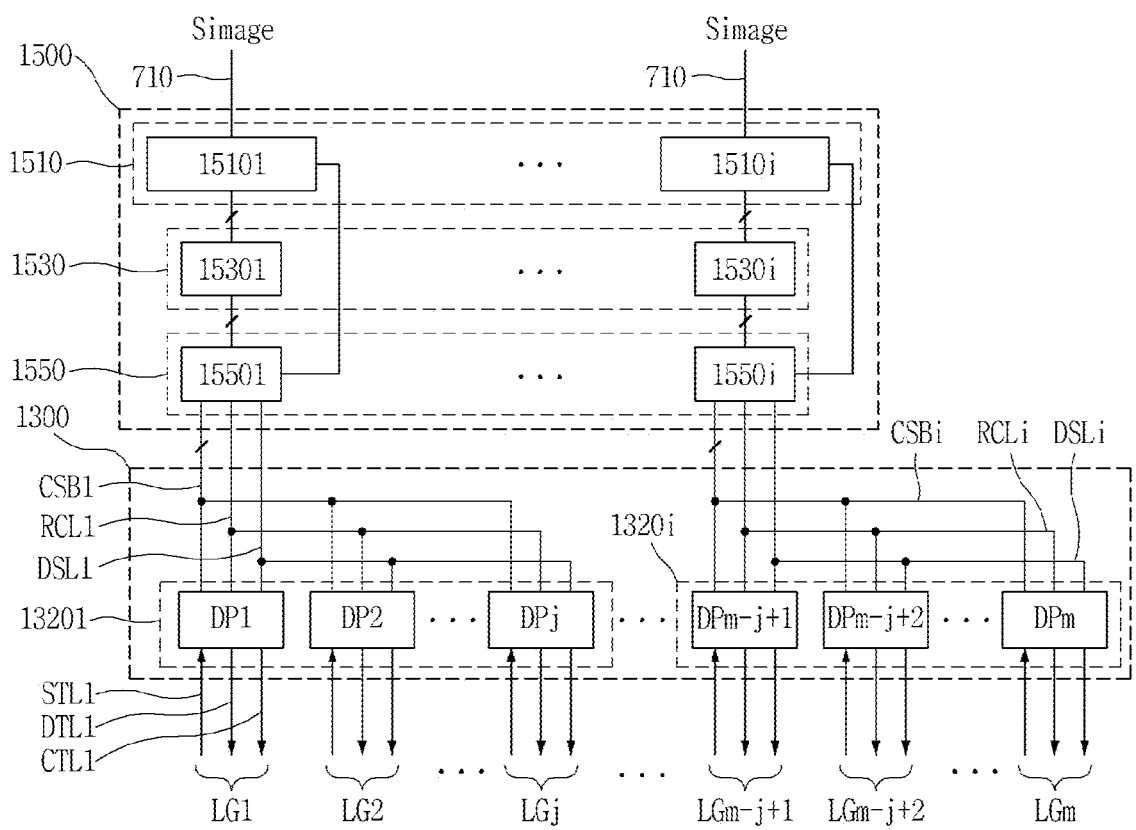
FIG. 24 is a diagram illustrating a timing controller chip array part and a data driving chip array part illustrated in FIGS. 22 and 23.

FIG. 24 is a diagram illustrating the timing controller chip array part and the data driving chip array part illustrated in FIGS. 22 and 23.

Referring to FIG. 24 in conjunction with FIGS. 3, 22, and 23, the timing controller chip array part 1500 of the display apparatus according to the present aspect may include an image signal transfer/receiving chip array 1510, an image quality improvement chip array 1530, and a data control chip array 1550.

The image signal transfer/receiving chip array 1510 may receive an image signal Simage input from the display driving system 700 through the pad part PP and may output the digital pixel data in units of at least one horizontal line. The image signal transfer/receiving chip array 1510 may receive the digital data signal based on the differential signal from the display driving system 700 according to the high serial interface manner, generate digital pixel data corresponding to at least one horizontal line, based on the received digital data signal, and generate the reference clock and the data start signal from the differential signal. Also, during the touch data reporting period, the image signal transfer/receiving chip array 1510 may collect the pixel driving line group-based touch presence data supplied from the data driving chip array part 1300 to generate the touch map data and may transfer the touch map data to the display driving system 700 according to the high speed serial interface manner. In this case, the image signal Simage and the touch map data may be transferred or received between the display driving system 700 and the image signal transfer/receiving chip array 1510 according to the high speed serial interface manner (for example, the V-by-one interface manner).

According to an aspect, the image signal transfer/receiving chip array 1510 may include first to $i^{th}$ image signal transfer/receiving chips 15101 to 1510i. In this case, each of the first to $i^{th}$ image signal transfer/receiving chips 15101 to 1510i may be a minimum-unit microchip or one chipset and may be a semiconductor packaging device which includes an IC including transistors and has a fine size.

In order to perform synchronization and data communication between the first to $i^{th}$ image signal transfer/receiving chips 15101 to 1510i, the first image signal transfer/receiving chip 15101 may be programmed as a master to control overall operations and functions in the image signal transfer/receiving chip array 1510, and each of the second to $i^{th}$ image signal transfer/receiving chips 15102 to 1510i may be programmed as a slave to operate in synchronization with the first image signal transfer/receiving chip 15101.

Each of the first to $i^{th}$ image signal transfer/receiving chips 15101 to 1510i individually receives digital data signals to be supplied to j pixels among differential signals for the image signal S image transferred from the display driving system 700 through an interface cable 710, individually generates pixel data to be supplied to the j pixels on the basis of the received digital data signals, and individually generates a reference clock and a data start signal from the differential signals for the image signal Simage. For example, when the interface cable 710 has first to $i^{th}$ lanes, the first image signal transfer/receiving chip 15101 individually receives digital data signals corresponding to first to $i^{th}$ pixels from the differential signals for the image signal Simage transferred from the display driving system 700 through the first lane of the interface cable 710, individually generates pixel data corresponding to the first to $j^{th}$ pixels on the basis of the received digital data signals, and individually generates a reference clock and a data start signal from the differential signals for the image signal Simage. Also, the $i^{th}$ image signal transfer/receiving chip 1510i individually receives digital data signals corresponding to m−j+$1^{th}$ to $m^{th}$ pixels from the differential signals for the image signal Simage transferred from the display driving system 700 through the $i^{th}$ lane of the interface cable 710, individually generates pixel data corresponding to the m−j+$1^{th}$ to $m^{th}$ pixels on the basis of the received digital data signals, and individually generates a reference clock and a data start signal from the differential signals for the image signal Simage.

Each of the first to $i^{th}$ image signal transfer/receiving chips 15101 to 1510i may generate display setting data for the timing controller chip array part 1500 from a differential signal of a first frame input through the interface cable 710, store the display setting data in an internal memory, and generate a digital data signal, a reference clock, and a data start signal from differential signals for frames that are sequentially input through the interface cable 710.

During the touch data reporting period, each of the first to $i^{th}$ image signal transfer/receiving chips 15101 to 1510i may receive the touch map data supplied from first to $i^{th}$ data control chips 15501 to 1550i according to the serial interface manner and may transfer the received touch map data to the display driving system 700 according to the high speed serial interface manner.

According to an aspect, the image signal transfer/receiving chip array 1510 may be configured with only one image signal transfer/receiving chip. That is, the first to $i^{th}$ image signal transfer/receiving chips 15101 to 1510i may be integrated into a single integrated image signal transfer/receiving chip.

The image quality improvement chip array 1530 may receive a frame-based digital data signal from the image signal transfer/receiving chip array 1510 and may execute a predetermined image quality improvement algorithm to improve the quality of an image corresponding to the frame-based digital data signal.

According to an aspect, the image quality improvement chip array 1530 may include first to $i^{th}$ image quality improvement chips 15301 to 1530i respectively connected to the first to $i^{th}$ image signal transfer/receiving chips 15101 to 1510i. The first to $i^{th}$ image quality improvement chips 15301 to 1530i may receive digital data signals from the first to $i^{th}$ image signal transfer/receiving chips 15101 to 1510i and may execute the predetermined image quality improvement algorithm to improve image quality according to the frame-based digital data signal. In this case, each of the first to $i^{th}$ image quality improvement chips 15301 to 1530i may be a minimum-unit microchip or one chipset and may be a semiconductor packaging device which includes an IC including transistors and has a fine size.

In order to perform synchronization and data communication between the first to $i^{th}$ image quality improvement chips 15301 to 1530i, the first image quality improvement chip 15301 may be programmed as a master to control overall operations and functions in the image quality improvement chip array 1530, and each of the second to $i^{th}$ image quality improvement chips 15302 to 1530i may be programmed as a slave to operate in synchronization with the first image quality improvement chip 15301.

When the image signal transfer/receiving chip array 1510 is configured as a single integrated data receiving chip, the first to $i^{th}$ image quality improvement chips 15301 to 1530i may be integrated into a single integrated image quality improvement chip connected to the integrated data receiving chip.

Based on the reference clock and the data start signal provided from the image signal transfer/receiving chip array 1510, the data control chip array 1550 may align and output digital pixel data with image quality improved by the image quality improvement chip array 1530 in units of one horizontal line.

The data control chip array 1550 according to an aspect may include first to $i^{th}$ data control chips 15501 to 1550i respectively connected to the first to $i^{th}$ image quality improvement chips 15301 to 1530i. The first to $i^{th}$ data control chips 15501 to 1550i may receive the digital pixel data with improved image quality from the first to $i^{th}$ image quality improvement chips 15301 to 1530i and may align and output the digital data signal according to the reference clock and the data start signal provided from the image signal transfer/receiving chip array 1510. In this case, each of the first to $i^{th}$ data control chips 15501 to 1550i may be a minimum-unit microchip or one chipset and may be a semiconductor packaging device which includes an IC including transistors and has a fine size.

In order to perform synchronization and data communication between the first to $i^{th}$ data control chips 15501 to 1550i, the first data control chip 15501 may be programmed as a master to control overall operations and functions in the data control chip array 1550, and each of the second to $i^{th}$ data control chips 15502 to 1550i may be programmed as a slave to operate in synchronization with the first data control chip 15501.

The first to $i^{th}$ data control chips 15501 to 1550i may individually output digital pixel data according to the serial data communication manner using first to $i^{th}$ common serial data buses CSB1 to CSBi each having a data bus corresponding to the number of bits of the digital pixel data, individually output the reference clock to first to $i^{th}$ common reference clock lines RCL1 to RCLi, and individually output the data start signal to first to $i^{th}$ data start signal lines DSL1 to DSLi. For example, the first image signal transfer/receiving chip 15101 may transfer corresponding digital pixel data, a corresponding reference clock, and a corresponding data start signal through the first common serial data bus CSB1, the first common reference clock line RCL1, and the first data start signal line DSL1. Also, the $i^{th}$ image signal transfer/receiving chip 1510i may transfer corresponding digital pixel data, a corresponding reference clock, and a corresponding data start signal through the $i^{th}$ common serial data bus CSBi, the $i^{th}$ common reference clock line RCLi, and the $i^{th}$ data start signal line DSLi.

During the touch data reporting period, each of the first to $i^{th}$ data control chips 15501 to 1550i may collect the pixel driving line group-based touch presence data supplied through the $i^{th}$ common serial data bus CSBi from the data driving chip array part 1300 to generate the touch map data and may transfer the touch map data to a corresponding image signal transfer/receiving chip of the first to $i^{th}$ image signal transfer/receiving chips 15101 to 1510i according to the serial interface manner.

When the image signal transfer/receiving chip array 1510 is configured as a single integrated data receiving chip and the image quality improvement chip array 1530 is configured as a single integrated image quality improvement chip, the first to $i^{th}$ data control chips 15501 to 1550i may be integrated into a single integrated data control chip connected to the integrated data receiving chip.

As described above, the timing controller chip array part 1500 may be mounted on the substrate 110 of the display panel 100 and may be connected to the display driving system 700 through one interface cable 710, thereby simplifying a connection structure between the display panel 100 and the display driving system 700.

The data driving chip array part 1300 of the display apparatus according to an aspect of the present disclosure may include first to $m^{th}$ data processing circuits DP1 to DPm.

Each of the first to $m^{th}$ data processing circuits DP1 to DPm may sample and hold in parallel digital pixel data transferred from the data transfer/receiving circuit 310 according to the reference clock, based on the data start signal and may output the reference clock and the held digital pixel data according to the serial data communication manner. In this case, each of the first to $m^{th}$ data processing circuits DP1 to DPm may be a minimum-unit microchip or one chip set and may be a semiconductor packaging device which includes an IC including transistors and has a fine size.

The first to $m^{th}$ data processing circuits DP1 to DPm may be grouped into first to $i^{th}$ data processing groups 13201 to 1320i, and in this case, each of the first to data processing $i^{th}$ groups 13201 to 1320i may include j data processing circuits.

On a group basis, the data processing circuits grouped into the first to $i^{th}$ data processing groups 13201 to 1320i may be connected to the first to $i^{th}$ common serial data buses CSB1 to CSBi in common. For example, each of the first to $j^{th}$ data processing circuits DP1 to DPj grouped into the first data processing group 13201 may receive corresponding digital pixel data, a corresponding reference clock, and a corresponding start signal through the first common serial data bus CSB1, the first common reference clock line RCL1, and the first data start signal line DSL1. Also, each of m−j+1$^{th}$ to m$^{th}$ data processing circuits DPm−j+1 to DPm grouped into the i$^{th}$ data processing group 1320i may receive corresponding digital pixel data, a corresponding reference clock, and a corresponding data start signal through the i$^{th}$ common serial data bus CSBi, the i$^{th}$ common reference clock line RCLi, and the i$^{th}$ data start signal line DSLi.

When digital pixel data having a corresponding number of bits is sampled and held, each of the first to m$^{th}$ data processing circuits DP1 to DPm may output a reference clock input thereto to a first clock transfer line CTL1 of each of first to m$^{th}$ pixel driving line groups LG1 to LGm and may output the held digital pixel data to a first pixel data transfer line DTL1 of each of the first to m$^{th}$ pixel driving line groups LG1 to LGm according to the serial data communication manner.

Moreover, the first to m$^{th}$ data processing circuits DP1 to DPm may respectively and time-serially receive touch presence data sequentially transferred through first sensing data transfer lines STL1 of the first to m$^{th}$ pixel driving line groups LG1 to LGm and may respectively supply the received touch presence data to the first to i$^{th}$ data transfer/receiving chips 3101 to 310i through the first to i$^{th}$ common serial data buses CSB1 to CSBi on a group basis. Therefore, on a corresponding data processing group basis, each of the first to i$^{th}$ data transfer/receiving chips 3101 to 310i may collect touch presence data to generate touch map data and may transfer the generated touch map data to the timing controller 500 according to the high speed serial interface manner.

Each of the first to m$^{th}$ data processing circuits DP1 to DPm according to an aspect may include a latch circuit which samples and latches digital pixel data input through a corresponding common serial data bus CSB according to the reference clock in response to the data start signal, a counter circuit which counts the reference clock to generate a data output signal, a clock bypass circuit which bypasses the reference clock input thereto, and a touch map data generator which collects touch presence data by units of data processing groups to generate touch map data.

Figure 25:
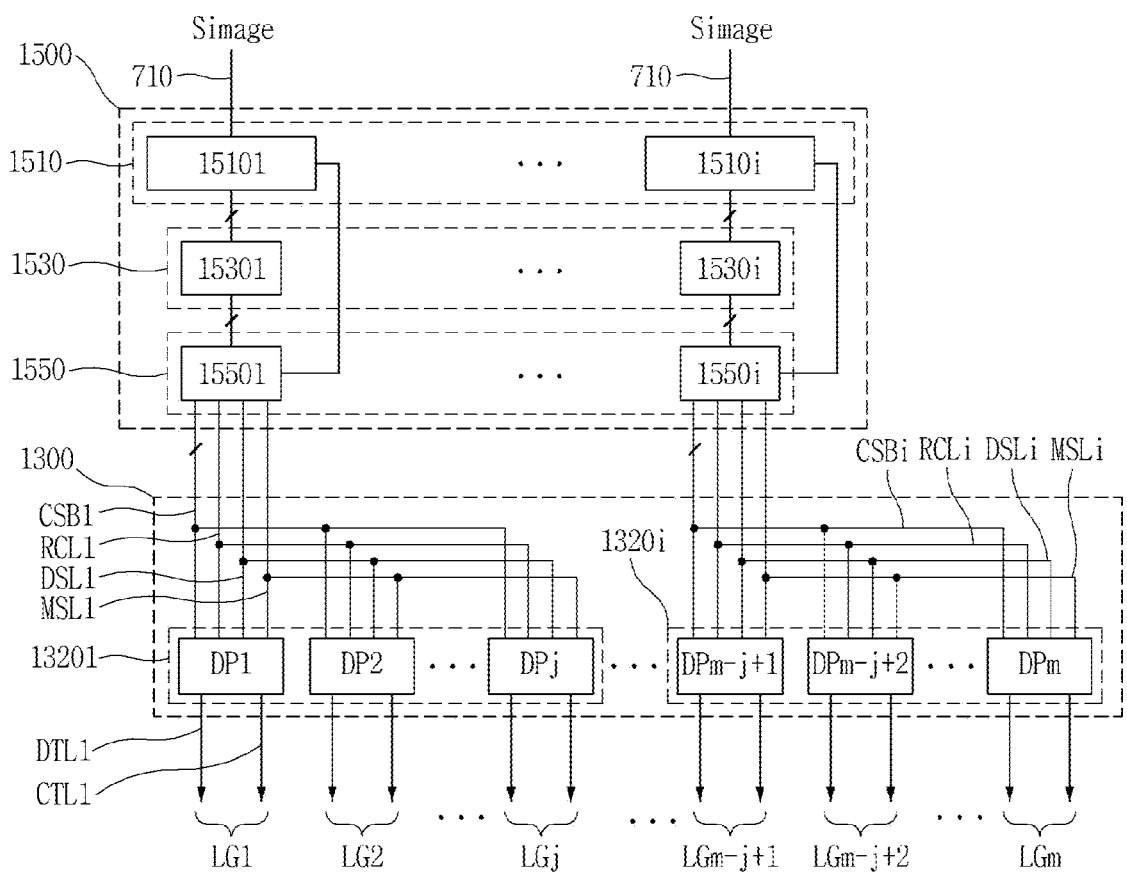
FIG. 25 is a diagram illustrating a data driving chip array part according to another aspect of the present disclosure illustrated in FIGS. 22 and 23.

FIG. 25 is a diagram illustrating a data driving chip array part according to another aspect of the present disclosure illustrated in FIGS. 22 and 23 and illustrates an example where a configuration of a data driving chip array part is modified to correspond to a structure of the substrate illustrated in FIG. 10.

Referring to FIG. 25 in conjunction with FIGS. 10, 22, and 23, a data driving chip array part 1300 according to another aspect of the present disclosure may include first to m$^{th}$ data processing circuits DP1 to DPm. The data driving chip array part 1300 according to the present aspect may be electrically connected to the first to m$^{th}$ pixel driving line groups LG1 to LGm illustrated in FIG. 10. Therefore, except for that digital pixel data is transferred and touch presence data is received through a pixel data transfer line DTL of each of the first to m$^{th}$ pixel driving line groups LG1 to LGm, the data driving chip array part 1300 according to the present aspect is the same as the data driving chip array part 1300 illustrated in FIG. 24. Hereinafter, therefore, only different elements will be described.

First, an image signal transfer/receiving chip array 1510 of a timing controller chip array part 1500 may include first to i$^{th}$ image signal transfer/receiving chips 15101 to 1510i. Each of the first to i$^{th}$ image signal transfer/receiving chips 15101 to 1510i may generate digital pixel data, a dot clock, a reference clock, and a data start signal through an interface with the display driving system 700. Also, each of the first to i$^{th}$ image signal transfer/receiving chips 15101 to 1510i may additionally generate a data transfer mode signal, based on the reference clock and may output the data transfer mode signal to the first to i$^{th}$ image signal transfer/receiving chips 15101 to 1510i of the image signal transfer/receiving chip array 1510. The first to i$^{th}$ image signal transfer/receiving chips 15101 to 1510i may respectively output the data transfer mode signal to the data driving chip array part 1300 through first to i$^{th}$ common mode signal lines MSL1 to MSLi. In this case, each of the first to i$^{th}$ image signal transfer/receiving chips 15101 to 1510i may generate the data transfer mode signal having a first logic state for transferring the digital pixel data, or may generate the data transfer mode signal having a second logic state for transferring sensing data. Except for that the data transfer mode signal is further generated and is supplied to the data driving chip array part 1300 through first to i$^{th}$ common mode signal lines MSL1 to MSLi, the timing controller chip array part 1500 is the same as the image signal transfer/receiving chip array 1510 illustrated in FIG. 24, and thus, its repetitive description will be omitted.

The data driving chip array part 1300 of a display apparatus according to the present aspect may include first to m$^{th}$ data processing circuits DP1 to DPm.

The first to m$^{th}$ data processing circuits DP1 to DPm may respectively output the digital pixel data to first pixel data transfer lines DTL1 of the first to m$^{th}$ pixel driving line groups LG1 to LGm in response to the data transfer mode signal having the first logic state and may respectively receive touch presence data sequentially transferred through first sensing data transfer lines STL1 of the first to m$^{th}$ pixel driving line groups LG1 to LGm in response to the data transfer mode signal having the second logic state. Except for that the digital pixel data and the touch presence data are transferred according to the data transfer mode signal, the first to m$^{th}$ data processing circuits DP1 to DPm according to the present aspect are the same as the data driving chip array part 1300 illustrated in FIG. 24, and thus, their repeating descriptions will be omitted.

In the display apparatus according to another aspect, all circuits for allowing the display panel 100 to display an image corresponding to an image signal supplied from the display driving system 700 may be implemented as microchips mounted on the substrate 110, thereby obtaining the same effect as that of the display apparatus illustrated in FIGS. 1 to 21. Also, the microchips may be more easily simplified and integrated, and since the display apparatus is directly connected to the display driving system 700 through only one interface cable 710 or two interface cables, a connection structure between the display apparatus and the display driving system 700 may be simplified. Accordingly, the display apparatus according to another aspect may have a single plate shape, and thus, may have an enhanced sense of beauty in design.

As described above, according to the aspects of the present disclosure, since the display apparatus includes the sensing driving pixel including the pixel driving chip connected to the touch electrode, the display apparatus may display an image by using the sensing driving pixel and may sense a touch by using the touch electrode, and thus, may sense a user touch even without a separate touch driving circuit.

Moreover, according to the aspects of the present disclosure, a connection structure between the display driving system and the display panel is simplified, and thus, a sense of beauty in design of the display apparatus is enhanced.

Moreover, according to the aspects of the present disclosure, each of the gate driving circuit and the data driving pixel for driving each pixel of the display panel may be implemented as a microchip mounted on a substrate, and thus, a process of forming at least one TFT for each pixel of a general display panel may be omitted.

The above-described feature, structure, and effect of the present disclosure are included in at least one aspect of the present disclosure, but are not limited to only one aspect. Furthermore, the feature, structure, and effect described in at least one aspect of the present disclosure may be implemented through combination or modification of other aspects by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus comprising:
   a substrate including a display area including a plurality of pixel areas and a non-display area surrounding the display area;
   a plurality of pixels including a pixel driving chip provided in each of the plurality of pixel areas and a light emission part connected to the pixel driving chip; and
   a plurality of touch electrodes disposed in the display area and overlapping two or more pixel areas,
   wherein a first pixel driving chip of one of two or more pixel driving chips overlapping a corresponding touch electrode of the plurality of touch electrodes is connected to the corresponding touch electrode,
   wherein the first pixel driving chip outputs touch presence data based on a capacitance variation value of the corresponding touch electrode, and
   wherein the touch presence data consists of digital data.

2. The display apparatus of claim 1, wherein the first pixel driving chip receives digital pixel data and a reference clock, outputs a data current to the light emission part, and outputs the touch presence data based on the capacitance variation value of the corresponding touch electrode.

3. The display apparatus of claim 2, wherein a second pixel driving chip of another one of the two or more pixel driving chips overlapping a corresponding touch electrode of the plurality of touch electrodes is electrically disconnected from the corresponding touch electrode.

4. The display apparatus of claim 3, wherein the second pixel driving chip receives digital pixel data and a reference clock, outputs the data current to a corresponding light emission part.

5. The display apparatus of claim 4, further comprising a plurality of pixel data transfer lines and a plurality of clock transfer lines connected between the plurality of pixel driving chips arranged in a first direction.

6. The display apparatus of claim 5, wherein the digital pixel data is sequentially transferred through the plurality of pixel driving chips and the plurality of pixel data transfer lines, and the reference clock is sequentially transferred through the plurality of pixel driving chips and the plurality of clock transfer lines.

7. The display apparatus of claim 5, wherein each of the digital pixel data and the touch presence data is sequentially transferred through the plurality of pixel driving chips and the plurality of pixel data transfer lines.

8. The display apparatus of claim 5, wherein the digital pixel data and the touch presence data are alternately transferred.

9. The display apparatus of claim 5, further comprising a plurality of sensing data transfer lines connected between the plurality of pixel driving chips arranged in the first direction.

10. The display apparatus of claim 9, wherein the touch presence data is sequentially transferred through the plurality of pixel driving chips and the plurality of sensing data transfer lines.

11. The display apparatus of claim 2, further comprising a plurality of sensing data transfer lines connected between a plurality of first pixel driving chips arranged in a first direction,
    wherein the touch presence data is sequentially transferred through the plurality of first pixel driving chips and the plurality of sensing data transfer lines.

12. The display apparatus of claim 1, further comprising:
    a buffer layer disposed on the substrate to support a plurality of pixel driving chips;
    a first planarization layer disposed on the substrate to cover the plurality of pixel driving chips;
    a line layer disposed on the first planarization layer;
    a second planarization layer covering the line layer, wherein the light emission part is disposed on the second planarization layer;
    an encapsulation layer covering the light emission part; and
    a touch electrode layer including the plurality of touch electrodes disposed on the encapsulation layer.

13. The display apparatus of claim 12, wherein the touch electrode layer includes:
    a touch routing line disposed on the encapsulation layer and connected to the first pixel driving chip; and
    a touch insulation layer covering the touch routing line, wherein the plurality of touch electrodes is disposed on the touch insulation layer.

14. The display apparatus of claim 1, further comprising:
    a buffer layer disposed on the substrate to support a plurality of pixel driving chips; and
    a planarization layer disposed on the substrate to cover the plurality of pixel driving chips,
    wherein the plurality of touch electrodes is disposed between the substrate and the buffer layer.

15. The display apparatus of claim 14, further comprising a touch electrode connection pattern disposed on the planarization layer to electrically connect the first pixel driving chip to one touch electrode, overlapping the first pixel driving chip, of the plurality of touch electrodes.

16. The display apparatus of claim 14, wherein the first pixel driving chip includes at least one rear bump, wherein the at least one rear bump protrudes from a rear surface of the first pixel driving chip and is directly connected to a corresponding touch electrode through the buffer layer.

17. The display apparatus of claim 1, wherein the first pixel driving chip includes a touch sensing circuit outputting the touch presence data based on the capacitance variation value of the corresponding touch electrode.

18. The display apparatus of claim 1, wherein the touch presence data is sequentially transferred by using the cascade manner through the pixel driving chip of each of the plurality of pixels arranged in a first direction.

19. A display apparatus including a substrate having a display area including a plurality of pixel areas and a non-display area surrounding the display area, comprising:
- a plurality of touch electrodes disposed in the display area;
- a plurality of sensing driving pixels respectively provided in the plurality of pixel areas, overlapping the plurality of touch electrodes and respectively and electrically connected to the plurality of touch electrodes; and
- a plurality of normal driving pixels respectively provided in the plurality of pixel areas and overlapping the plurality of touch electrodes,
- wherein the plurality of sensing driving pixels each includes:
- a first pixel driving chip provided in each of the plurality of pixel areas and electrically connected to a corresponding touch electrode; and
- a light emission part electrically connected to the first pixel driving chip,
- wherein the first pixel driving chip of the plurality of sensing driving pixels respectively outputs touch presence data based on a capacitance variation value of the connected touch electrode, and
- wherein the touch presence data consists of digital data.

20. The display apparatus of claim 19, wherein the plurality of normal driving pixels are respectively and electrically disconnected from the plurality of touch electrodes.

21. The display apparatus of claim 19, wherein the plurality of normal driving pixels each includes:
- a second pixel driving chip provided in each of the plurality of pixel areas of the substrate; and
- a light emission part electrically connected to the second pixel driving chip.

22. The display apparatus of claim 19, further comprising:
- a buffer layer disposed on the substrate to support the first pixel driving chip; and
- a planarization layer disposed on the substrate to cover the first pixel driving chip,
- wherein the plurality of touch electrodes is disposed between the substrate and the buffer layer.

23. The display apparatus of claim 22, further comprising a touch electrode connection pattern disposed on the planarization layer to electrically connect the first pixel driving chip to the corresponding touch electrode.

24. The display apparatus of claim 22, wherein the first pixel driving chip comprises at least one rear bump,
- wherein the at least one rear bump protrudes from a rear surface of the first pixel driving chip and is directly connected to a corresponding touch electrode through the buffer layer.

25. The display apparatus of claim 19, wherein the first pixel driving chip includes a touch sensing circuit outputting the touch presence data based on the capacitance variation value of the corresponding touch electrode.

26. The display apparatus of claim 19, wherein the touch presence data is sequentially transferred by using the cascade manner through the plurality of sensing driving pixels and the plurality of normal driving pixels arranged in a first direction.

* * * * *